US011994716B2

(12) United States Patent
Oh et al.

(10) Patent No.: US 11,994,716 B2
(45) Date of Patent: May 28, 2024

(54) WAVEGUIDE HEATER

(71) Applicant: ROCKLEY PHOTONICS LIMITED, Altrincham (GB)

(72) Inventors: James Dongyoon Oh, Alhambra, CA (US); Jeffrey Driscoll, San Jose, CA (US)

(73) Assignee: Rockley Photonics Limited, Altrincham (GB)

( * ) Notice: Subject to any disclaimer, the term of this patent is extended or adjusted under 35 U.S.C. 154(b) by 29 days.

(21) Appl. No.: 17/695,451

(22) Filed: Mar. 15, 2022

(65) Prior Publication Data

US 2022/0299704 A1 Sep. 22, 2022

Related U.S. Application Data

(60) Provisional application No. 63/163,014, filed on Mar. 18, 2021.

(51) Int. Cl.
*G02B 6/124* (2006.01)
*G02B 6/12* (2006.01)
(Continued)

(52) U.S. Cl.
CPC ............ *G02B 6/124* (2013.01); *H01S 5/0261* (2013.01); *G02B 2006/12097* (2013.01);
(Continued)

(58) Field of Classification Search
CPC ................ G02B 6/124; G02B 6/12002; G02B 2006/12097; G02B 2006/12121;
(Continued)

(56) References Cited

U.S. PATENT DOCUMENTS 5,363,457 A * 11/1994 Falt .................. G02F 1/025
385/2
8,768,132 B2 * 7/2014 Stewart ................. G02B 6/136
385/130
(Continued)

FOREIGN PATENT DOCUMENTS

EP 3 192 136 B1 7/2017
EP 3674780 A1 * 7/2020 ............. G02F 1/009
(Continued)

OTHER PUBLICATIONS

Hu, M. H. et al., "480-mW DBR Laser Integrated with Micro Heaters for Wavelength Tuning", May 2007, 3 pages, Optical Society of America.
(Continued)

*Primary Examiner* — Ryan A Lepisto
*Assistant Examiner* — Erin D Chiem
(74) *Attorney, Agent, or Firm* — Lewis Roca Rothgerber Christie LLP

(57) ABSTRACT

An optical waveguide structure. In some embodiments, the optical waveguide structure includes a semiconductor waveguide having a waveguide ridge, and a heater. The waveguide ridge may have a varying dopant concentration across its cross-section. The heater may include a first contact and a second contact, and the waveguide structure may include a conductive path from the first contact to the second contact, the conductive path extending through a doped portion of the waveguide ridge.

21 Claims, 39 Drawing Sheets

(51) Int. Cl.
*G02F 1/01* (2006.01)
*H01S 5/026* (2006.01)
*H01S 5/125* (2006.01)
*H01S 5/06* (2006.01)

(52) U.S. Cl.
CPC .. *G02B 2006/12121* (2013.01); *G02F 1/0147* (2013.01); *H01S 5/0612* (2013.01); *H01S 5/125* (2013.01)

(58) Field of Classification Search
CPC ........... G02B 2006/12061; G02B 2006/12135; G02B 2006/12161; G02B 2006/12176; H01S 5/026; H01S 5/0612; H01S 5/021; H01S 5/125
See application file for complete search history.

(56) References Cited

U.S. PATENT DOCUMENTS

| | | | |
|---|---|---|---|
| 9,122,085 B2* | 9/2015 | Rasras | G02F 1/0147 |
| 10,690,993 B2 | 6/2020 | Timurdogan et al. | |
| 2007/0133648 A1 | 6/2007 | Matsuda et al. | |
| 2012/0014398 A1 | 1/2012 | Choi | |
| 2012/0243825 A1 | 9/2012 | Takizawa et al. | |
| 2016/0377953 A1* | 12/2016 | Feng | G02F 1/011 385/2 |
| 2017/0269391 A1* | 9/2017 | Feng | G02F 1/0147 |
| 2017/0299902 A1* | 10/2017 | Yu | G02B 6/1228 |
| 2018/0159302 A1 | 6/2018 | McLaurin et al. | |
| 2019/0258094 A1* | 8/2019 | Oh | G02F 1/025 |
| 2020/0012043 A1* | 1/2020 | Abediasl | H01L 31/02327 |

FOREIGN PATENT DOCUMENTS

| | | |
|---|---|---|
| GB | 2587071 A | 3/2021 |
| JP | 2002043683 A * | 2/2002 |

OTHER PUBLICATIONS

Jacques, M. et al., "Optimization of thermo-optic phase-shifter design and mitigation of thermal crosstalk on the SOI platform", Optics Express, Apr. 15, 2019, pp. 10456-10471, vol. 27, No. 8, Optical Society of America.

Masood, A. et al., "Comparison of heater architectures for thermal control of silicon photonic circuits", Oct. 24, 2013, 2 pages.

International Search Report and Written Opinion of the International Searching Authority, dated Jul. 22, 2022, corresponding to PCT/EP2022/056891, 15 pages.

* cited by examiner

| Parameters | Nominal Dimension | Range | Note |
|---|---|---|---|
| wWG | 2.6um | 2-5um | Waveguide width |
| wSlab | 3-6um | 2-8um | Rib slab width |
| dDop | 3um | 1.5 – 4um | Clearance of doping from rib sidewall |
| Lheat | Lgrat + 10um | Lgrat + [0, 100]um | |
| Lgrat | Depends on DBR laser design, target reflectivity | 500-2000um | Length of grating |
| tWG | 3um | 0.5-4um | Waveguide height |
| tSlab | 1.8um | 1.6-2.0um | Rib slab height |
| tStripSlab | 0.25um | 0.1-0.5um | Strip slab thickness |
| wVia0 | 23.4um | 10-25um | Width of the via0 (NP_DEOX) |
| tMet | 2um | 1-3um | Height of M1 metal |
| gratW | 2.2um | | Grating teeth width |
| gratED | 0.3, 0.4um | 0.1-0.7um | Grating teeth depth |

FIG. 2C

| Region | Doping | xmin (um) | xmax (um) | ymin (um) | ymax (um) | Concentration (/cm3) | mobility (cm2/Vs) | Resistivity (Ohm*cm) |
|---|---|---|---|---|---|---|---|---|
| 1 | P | -1.3 | 1.3 | 2.7 | 2.9 | 5.5E+16 | 3.6E+02 | 3.2E-01 |
| 2 | P | -1.3 | 1.3 | 2.1 | 2.7 | 1.1E+17 | 3.1E+02 | 1.8E-01 |
| 3 | P | -1.3 | 1.3 | 1.9 | 2.1 | 5.5E+16 | 3.6E+02 | 3.2E-01 |
| 4 | P+ | -1.3 | 1.25 | 1.72 | 3 | 3.5E+17 | 2.2E+02 | 8.0E-02 |
| 5 | P+ | 1.25 | 1.3 | 1.72 | 3 | 3.5E+17 | 2.2E+02 | 8.0E-02 |
| 6 | P+ | -4.3 | 1.3 | 1.72 | 1.8 | 6.2E+18 | 8.1E+01 | 1.2E-02 |
| 7 | P+ | 1.3 | 4.3 | 1.72 | 1.8 | 6.2E+18 | 8.1E+01 | 1.2E-02 |
| 8 | P++ | -7.3 | -4.3 | 1.6 | 1.8 | 2.0E+20 | 4.8E+01 | 6.5E-04 |
| 9 | P++ | 4.3 | 7.3 | 1.6 | 1.8 | 2.0E+20 | 4.8E+01 | 6.5E-04 |
| 10 | P++ | -7.3 | -7.2 | 0 | 1.8 | 1.0E+19 | 7.1E+01 | 8.8E-03 |
| 11 | P++ | 7.2 | 7.3 | 0 | 1.8 | 1.0E+19 | 7.1E+01 | 8.8E-03 |
| 12 | P++ | -46.7 | -7.2 | 0 | 0.25 | 2.0E+20 | 4.8E+01 | 6.5E-04 |
| 13 | P++ | 7.2 | 46.7 | 0 | 0.25 | 2.0E+20 | 4.8E+01 | 6.5E-04 |

FIG. 2D

| Doping | Implant Details (Species, Dose, Energy, Tilt/Twist) |
|---|---|
| P | Boron, 1e13, 220keV, 0/0 |
| P+ | Boron, 3e13, 30keV, 10/0 |
| | Boron, 3e13, 30keV, 10/180 |
| P++ | Boron, 1e15, 15keV, 10/0 |
| | Boron, 1e15, 45keV, 10/0 |
| | Boron, 1e15, 60keV, 10/0 |
| | Boron, 1e15, 15keV, 10/180 |
| | Boron, 1e15, 45keV, 10/180 |
| | Boron, 1e15, 60keV, 10/180 |

| Design wavelength (um) | DBR Length (um) | wSlab (um) | dDop (um) | IL (dB) | Efficiency (mmC/W) | Wavelength shift at 3V (nm) | i (A) | R (Ohm) |
|---|---|---|---|---|---|---|---|---|
| 1.38 | 1624 | 4 | 2 | 0.08 | 54.4 | 1.53 | 0.20 | 15.1 |
| 1.55 | 1147 | 4 | 2 | 0.08 | 54.4 | 1.75 | 0.15 | 20.5 |
| 2.32 | 938 | 4 | 2 | 0.17 | 54.8 | 2.36 | 0.10 | 28.9 |

FIG. 2Q

| Parameters | Nominal Dimension | Range | Note |
|---|---|---|---|
| wWG | 2.6um | 2-5um | Waveguide width |
| wSlab | 3-6um | 2-8um | Rib slab width |
| dDop | 2-3um | 1.5-4um | Clearance of N++/P++ doping from rib sidewall |
| wDop | 5um | 1-10um | Width of P++ doping on 0.25um slab |
| Lheat | Lgrat + 10um | Lgrat + [0, 100]um | |
| Lgrat | Depends on DBR laser design, target reflectivity | 500-2000um | Length of grating |
| tWG | 3um | 0.5-4um | Waveguide height |
| tSlab | 1.8um | 1.6-2.0um | Rib slab height |
| tStripSlab | 0.25um | 0.1-0.5um | Strip slab thickness |
| wVia0 | 23.4um | 10-25um | Width of the via0 (NP_DEOX) |
| tMet | 2um | 1-3um | Height of M1 metal |
| gratW | 2.2um | | Grating teeth width |
| gratED | 0.3, 0.4um | 0.1-0.7um | Grating teeth depth |

FIG. 3C

| Design wavelength (um) | DBR Length (um) | wSlab (um) | dDop (um) | IL (dB) | Efficiency (mmC/W) | Wavelength shift at 3V (nm) | i (A) | R (Ohm) |
|---|---|---|---|---|---|---|---|---|
| 1.28 | 1624 | 4 | 2 | 0.08 | 27 | 0.77 | 0.14 | 15.1 |
| 1.55 | 1147 | 4 | 2 | 0.08 | 27 | 0.87 | 0.10 | 20.5 |
| 2.32 | 938 | 4 | 2 | 0.17 | 27 | 1.18 | 0.07 | 28.9 |

FIG. 3H

| Parameters | Nominal Dimension | Range | Note |
|---|---|---|---|
| wWG | 3um | 2-5um | Waveguide width |
| Lheat | 500-1000um | 250-1500um | Can be optimized for required phase shift and max operating voltage |
| tWG | 3um | 0.5-4um | Waveguide height |
| tStripSlab | 0.25um | 0.1-0.5um | Strip slab thickness |
| wVia0 | 23.4um | 10-25um | Width of the via0 (NP_DEOX) |
| tMet | 2um | 1-3um | Height of M1 metal |

FIG. 4C

| efficiency (mmC/W) | Phase shifter length (mm) | IL (dB) | Ppi at 2400nm (W) | R (Ohm) | Vpi at 2400nm (V) | Ipi at 2400nm (A) |
|---|---|---|---|---|---|---|
| 84.6 | 1 | 0.12 | 0.083 | 78.0 | 2.54 | 0.033 |
| 84.6 | 0.5 | 0.06 | 0.083 | 156.0 | 3.60 | 0.023 |

FIG. 4G

| Parameters | Nominal dimension | Range | Note |
|---|---|---|---|
| wWG | 3um | 2-5um | Waveguide width |
| tWG | 3um | 0.5-4um | Waveguide height |
| tSlab | 0.3um | 0.15-0.5um | Slab thickness |
| wVia | 10um | 5-20um | Width of the via |
| tMet | 1um | 0.5-2um | Metal thickness |
| encMet | 5um | 1-10um | Metal enclosure of the via |
| clMet | 5um | 0-10um | Clearance of metal from WG |

FIG. 5C

| Parameters | Nominal dimension | Range | Note |
|---|---|---|---|
| wWG | 2.6um | 2-5um | Waveguide width |
| wSlab | 4um | 3-5um | |
| tWG | 3um | 0.5-4um | Waveguide height |
| tSlab | 0.28um | 0.15-0.5um | Slab thickness |
| wVia | 10um | 5-20um | Width of the via |
| tMet | 1um | 0.5-2um | Metal thickness |
| encMet | 5um | 1-10um | Metal enclosure of the via |
| clMet | 5um | 0-10um | Clearance of metal from WG |
| clDop | 2um | 1-2um | Clearance of doping from rib sidewall |

FIG. 5E

WAVEGUIDE HEATER

CROSS-REFERENCE TO RELATED APPLICATION(S)

The present application claims priority to and the benefit of U.S. Provisional Application No. 63/163,014, filed Mar. 18, 2021, entitled "WAVEGUIDE HEATER", the entire content of which is incorporated herein by reference.

FIELD

One or more aspects of embodiments according to the present disclosure relate to photonic systems, and more particularly to a heater for heating an optical waveguide.

BACKGROUND

In photonic systems, it may be advantageous to adjust the temperature of various structures, such as a waveguide or a waveguide with a Bragg grating, for the purpose, for example, of adjusting or controlling characteristics that vary with temperature.

Thus, there is a need for a heater for use in a photonic system.

SUMMARY

According to an embodiment of the present disclosure, there is provided an optical waveguide structure, including: a semiconductor waveguide having a waveguide ridge, and a heater, the waveguide ridge having a varying dopant concentration across its cross-section, the heater including a first contact and a second contact, the waveguide structure including a conductive path from the first contact to the second contact, the conductive path extending through a doped portion of the waveguide ridge.

In some embodiments, the first contact and the second contact are on opposite sides of the waveguide ridge.

In some embodiments, the optical waveguide structure has a conductivity distribution such that a potential difference between the first contact and the second contact results in a current, between the first contact and the second contact, at least half of which flows through the waveguide ridge.

In some embodiments, the current is, at a point within the waveguide ridge, in a direction that is within 45 degrees of a direction perpendicular to the waveguide ridge.

In some embodiments: the waveguide ridge has a top surface; and a doping concentration within the waveguide ridge at a first depth, from the top surface, is at least 10% greater than a doping concentration within the waveguide ridge at a second depth, from the top surface, the second depth being greater than the first depth.

In some embodiments, the waveguide ridge has a first sidewall and a second sidewall, and a doping concentration, at a point midway between the first sidewall and the second sidewall, between $5e16/cm^3$ and $5e17/cm^3$.

In some embodiments, the waveguide structure is configured to have, in steady state operation with a voltage of 3 V between the first contact and the second contact, a temperature that is uniform to within 30 degrees C. within a waveguide of the waveguide structure.

In some embodiments, in steady state operation with a voltage of 3 V between the first contact and the second contact, the minimum temperature within the semiconductor waveguide is at least 20 degrees greater than in steady state operation with no current flowing through the heater.

In some embodiments, a waveguide of the waveguide structure has an optical insertion loss of less than 1 dB per millimeter.

In some embodiments, the waveguide structure includes a grating having a temperature-dependent reflectivity peak.

According to an embodiment of the present disclosure, there is provided a distributed Bragg reflector laser, including a waveguide structure.

In some embodiments: in steady state operation, with a voltage of 0 V between the first contact and the second contact, the reflectivity peak is at a first wavelength, in steady state operation, with a voltage of 3 V between the first contact and the second contact, the reflectivity peak is at a second wavelength, and the second wavelength is greater than the first wavelength by at least 0.1 nm.

In some embodiments, the power dissipated in the heater, with a voltage of 3 V between the first contact and the second contact, is less than 1 W.

In some embodiments, the optical waveguide structure includes a rib waveguide.

In some embodiments, the optical waveguide structure includes a strip waveguide.

In some embodiments, the waveguide ridge has a width greater than 2 microns.

In some embodiments: the waveguide structure is on a silicon on insulator chip, including: a substrate, a buried oxide layer on the substrate, and a device layer on the buried oxide layer; and the waveguide structure includes a trench, in the device layer, between the semiconductor waveguide and the first contact, the thickness of the device layer at the bottom of the trench being less than 1 micron.

In some embodiments, a time constant of the waveguide structure, relating current flow through the heater to temperature of a waveguide of the waveguide structure, is less than 20 microseconds.

In some embodiments, the optical waveguide structure further includes a diode connected in series with the heater.

In some embodiments, the heater includes a first heater and a second heater, connected in parallel.

In some embodiments, the heater includes a first heater and a second heater, connected in series.

BRIEF DESCRIPTION OF THE DRAWINGS

Features, aspects, and embodiments are described in conjunction with the attached drawings, in which:

FIG. 2C is a table of dimensions, according to an embodiment of the present disclosure;

FIG. 2D is a table of doping parameters, according to an embodiment of the present disclosure;

FIG. 2Q is a table of performance parameters, according to an embodiment of the present disclosure;

FIG. 3C is a table of dimensions, according to an embodiment of the present disclosure;

FIG. 3H is a table of performance parameters, according to an embodiment of the present disclosure;

FIG. 4C is a table of dimensions, according to an embodiment of the present disclosure;

FIG. 4G is a table of performance parameters, according to an embodiment of the present disclosure;

FIG. 5C is a table of dimensions, according to an embodiment of the present disclosure;

FIG. 5E is a table of dimensions, according to an embodiment of the present disclosure;

DETAILED DESCRIPTION

The detailed description set forth below in connection with the appended drawings is intended as a description of exemplary embodiments of a waveguide heater provided in accordance with the present disclosure and is not intended to represent the only forms in which some embodiments may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
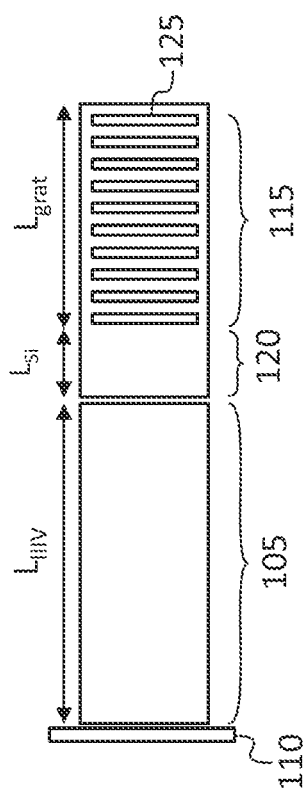
FIG. 1A is a schematic drawing of a laser, according to an embodiment of the present disclosure.
Figure 1B:
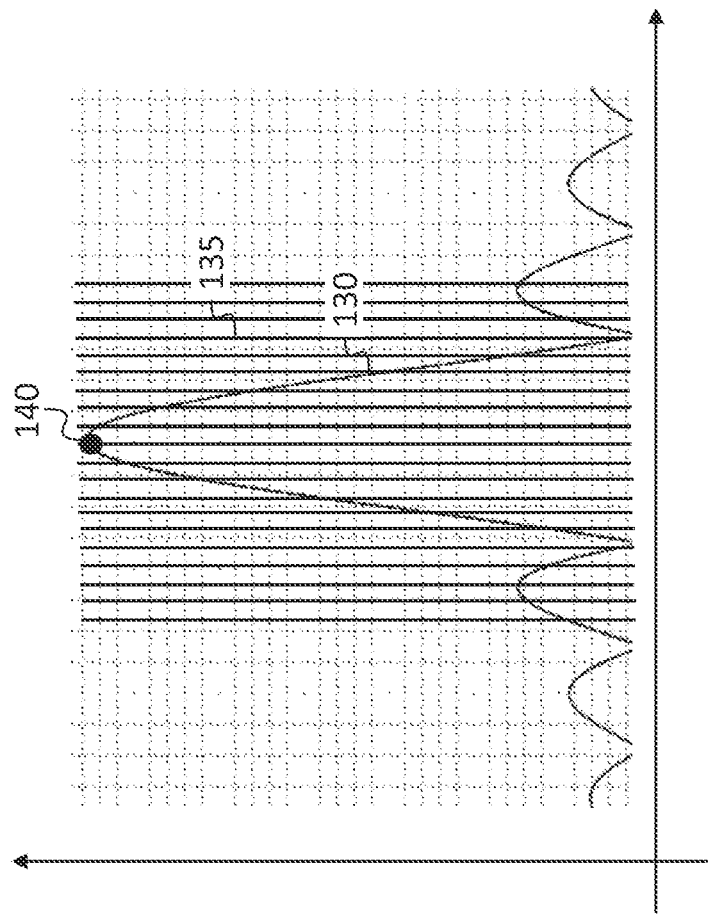
FIG. 1B is a graph of a reflectivity peak and a plurality of cavity modes, according to an embodiment of the present disclosure.

FIG. 1A is a schematic drawing of a distributed Bragg reflector (DBR) laser A gain element (e.g., a III-V semiconductor optical amplifier (SOA)) 105 provides gain within an optical cavity defined at one end by a mirror (e.g., a metal (e.g., gold) mirror) 110 and at the other end by a Bragg grating 115. The Bragg grating 115, which may have a length $L_{grat}$, may be formed in a silicon waveguide (which may be a waveguide on a photonic integrated circuit (PIC)) and it may be connected to the semiconductor optical amplifier 105 by a silicon waveguide 120 (which may be an extension of the waveguide in which the Bragg grating is formed) having a length $L_{si}$. The Bragg grating may be formed by etching, into the silicon waveguide, a repeated pattern of transverse trenches 125. FIG. 1B shows (i) the reflectivity 130 of the Bragg grating as a function of wavelength, and (ii) a plurality of longitudinal cavity modes 135 at a corresponding plurality of cavity mode wavelengths. The laser may lase (i.e., generate laser light) at a wavelength 140 corresponding to the cavity mode at which the reflectivity 130 of the Bragg grating is greatest.

Figure 1C:
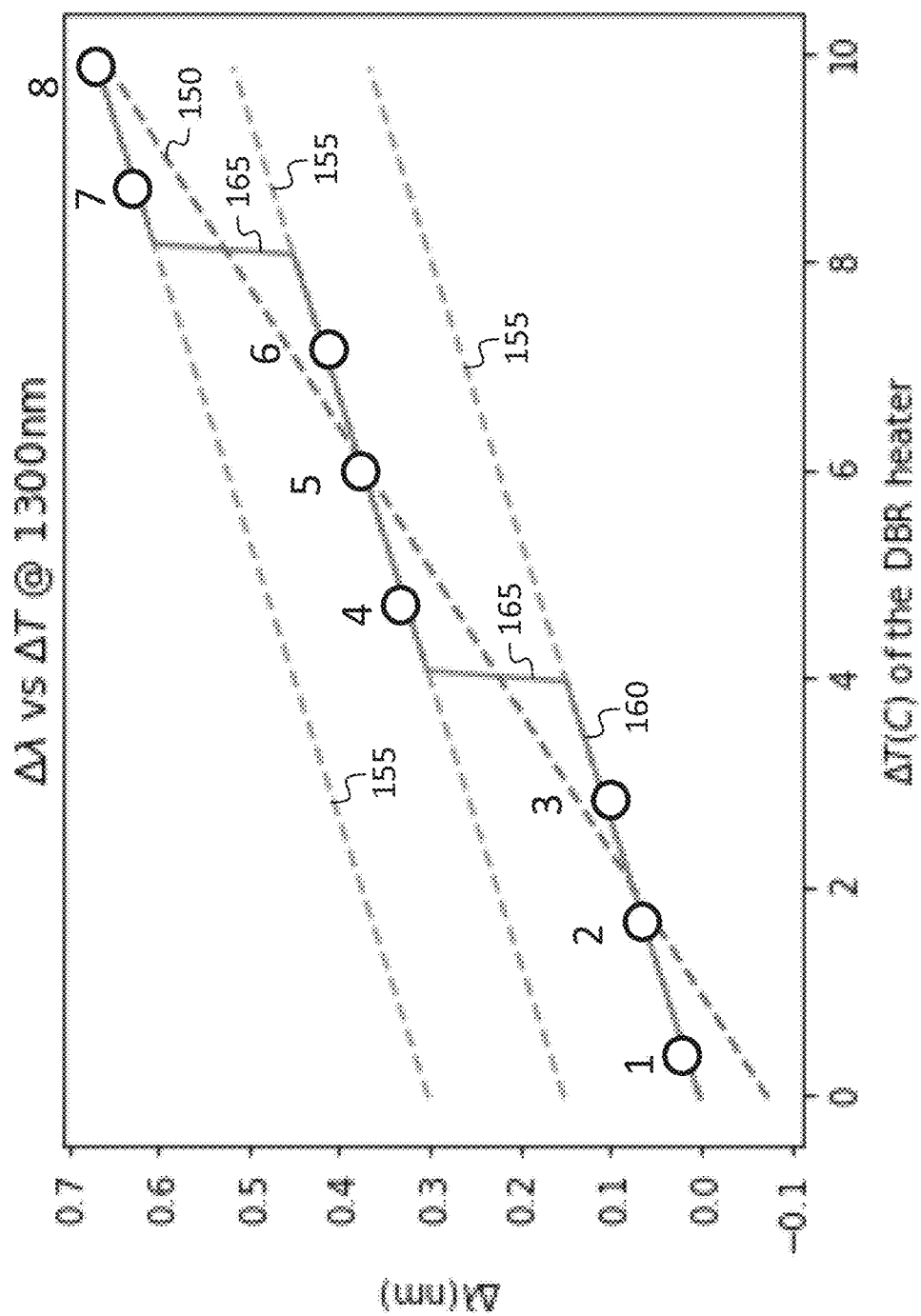
FIG. 1C is a graph of wavelengths as a function of temperature, according to an embodiment of the present disclosure.

FIG. 1C is a graph, as a function of temperature, (i) of the wavelength 150 of the reflectivity peak of the Bragg grating and (ii) of the respective wavelengths of three cavity modes. As the temperature is increased, the operating wavelength of the laser increases, occasionally hopping to an adjacent mode. To avoid the occurrence of mode hops 165, the laser may be shut off before the temperate increases to the temperature at which such a mode hop would occur, e.g., the laser may be operated only during intervals of time (corresponding to the circles in FIG. 1C) during which the temperature is not near a temperature corresponding to a mode hop 165.

Figure 2A:
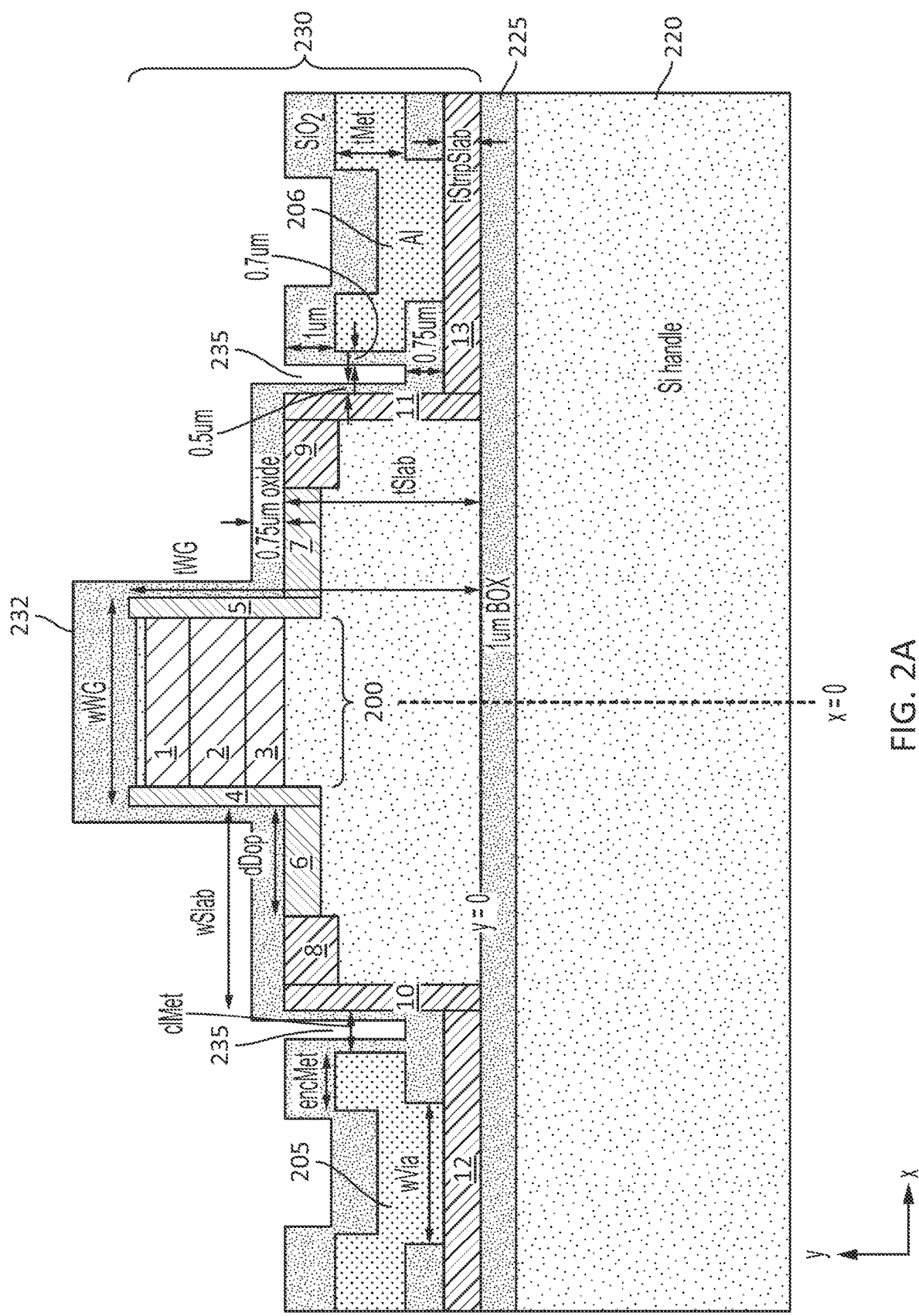
FIG. 2A is a schematic drawing of a waveguide structure, according to an embodiment of the present disclosure.

FIG. 2A is a cross-sectional view of a waveguide structure including a waveguide with a heater. The heater includes a resistive heating element 200, which may be connected to a drive circuit through conductive current paths including a first low-resistance path and a second low-resistance path. The first low-resistance path may include a metal wire 201 (FIG. 2B), a metal to silicon via 205 (between a first metal layer and the silicon of the device layer 230), and highly doped and moderately doped regions. The highly doped regions may include a first (horizontal) highly doped region 12, a second (vertical) highly doped region 10, and a third (horizontal) highly doped region 8. The moderately doped regions may include a first (horizontal) moderately doped region 6 and a second (vertical) moderately doped region 4. A layer of silicon dioxide (or simply "oxide") may cover the waveguide and operate as an upper cladding layer 232 for the waveguide, and the buried oxide layer 225 may operate as a lower cladding layer for the waveguide.

Figure 2B:
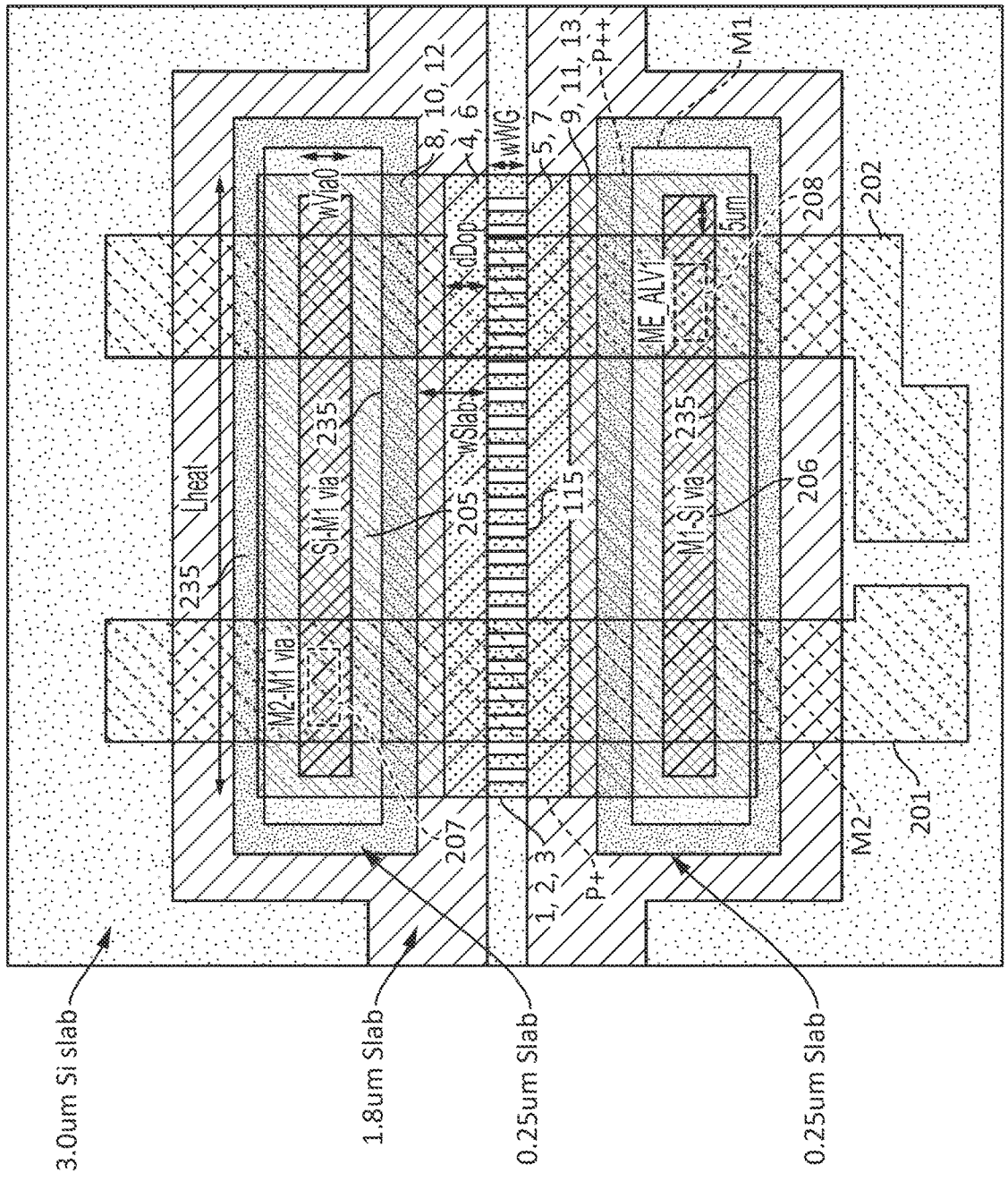
FIG. 2B is a schematic drawing of a waveguide structure, according to an embodiment of the present disclosure.

The doped regions 1-12 may overlap. In some embodiments, the doped regions 1-12 are formed by ion implantation doping and their cross sections are not precisely rectangular as shown but are instead rounded oblong shapes. Similarly, the doping concentration within each of the rectangular shapes may not be perfectly uniform. The waveguide structure may be on a silicon on insulator chip including a substrate (or "silicon handle") 220, a buried oxide (BOX) layer 225 on the substrate 220, and a device layer 230 on the buried oxide layer 225. The metal wire 201 may be formed in a second layer of metal and connected to the first layer of metal through a metal to metal via 207 (FIG. 2B).

Similarly, the second low-resistance path may include a metal wire 202 (FIG. 2B), a via 206, and highly doped and moderately doped regions. The highly doped regions may include a first highly doped region 13, a second highly doped region 11, and a third highly doped region 9, and the moderately doped regions may include a first moderately doped region 7 and a second moderately doped region 5. The metal wire 202 of the second low-resistance path may be formed in the second layer of metal and connected to the first layer of metal through a metal to metal via 208 (FIG. 2B). The metal to silicon via 205 of the first low-resistance path may operate as a first contact to the heater that consists of the highly doped regions, the moderately doped regions, and the lightly doped regions, and the metal to silicon via 206 of the second low-resistance path may operate as a second contact to this heater.

When a voltage is applied between the first contact and the second contact, current may flow through the heater, and the current flow in the heating element (in the lightly doped regions) may be substantially transverse, e.g., the direction of the current may be perpendicular to the waveguide ridge, or, if the direction of the current is not precisely perpendicular to the waveguide ridge, it may be, at any point within the heating element, within a certain angle of being perpendicular (e.g., it may be within 10 degrees of being perpendicular to the waveguide ridge), where the angle may be less than 60 degrees (e.g., less than 45 degrees, e.g., less than 10 degrees).

The heating element 200 may include a plurality of lightly doped regions through which heating current may flow in parallel current paths, including a first lightly doped region 1, a second lightly doped region 2, and a third lightly doped region 3. In some embodiments the boundaries between the first lightly doped region 1, a second lightly doped region 2, and a third lightly doped region 3 are not sharp or distinct, and in such an embodiment, these three lightly doped regions may equivalently be considered to be a single lightly doped region within which the doping concentration is nonuniform. Thermal isolation trenches 235 may be formed in the device layer 230 on each side of the waveguide, to reduce the flow of heat laterally within the device layer 230. Additional thermal isolation trenches 235 may also be formed on the other side of each of the vias 205, 206 (FIG. 2B). FIG. 2B is a top view of the embodiment of FIG. 2A.

The table of FIG. 2C shows values, and ranges, in microns (um) for dimensions shown in FIG. 2B. In some embodiments, the dimensions are not precisely those shown but any of the dimensions is between half the value shown and twice the value shown. For an embodiment in which the semiconductor is silicon, the table of FIG. 2D shows the extent in space (from a left edge at xmin to a right edge at xmax and from a lower edge at y min to an upper edge at ymax) and the doping concentration for each of the lightly doped, moderately doped, and heavily doped regions, in some embodiments. For example, in one embodiment, the first lightly doped region 1 may extend from x=−1.3 microns (um) to x=1.3 microns and from y=2.7 microns to y=2.9 microns (where the x and y directions and origin are shown in FIG. 2A). The table of FIG. 2D also shows the resulting mobility and resistivity. For another semiconductor (i.e., a semiconductor that is not silicon), the doping concentration may be adjusted to achieve a similar resistivity in each region. In some embodiments the doping concentration of one or more of the regions is not exactly that shown in the table of FIG. 2D but is instead a different value, between half of the doping concentration shown in the table of FIG. 2D and two times the doping concentration shown in the table of FIG. 2D. As mentioned above, the doping concentration may not be uniform within each of the rectangular regions defined in the table of FIG. 2D; as such, the doping concentration listed (or a doping concentration within the corresponding range of doping concentrations mentioned above) may be present at at least one point within the region, e.g., at the center of the rectangle (midway between the left and right edge and midway between the top and bottom edge). In some embodiments, N-type doping is used instead of P-type doping, to similar effect.

Figure 2E:
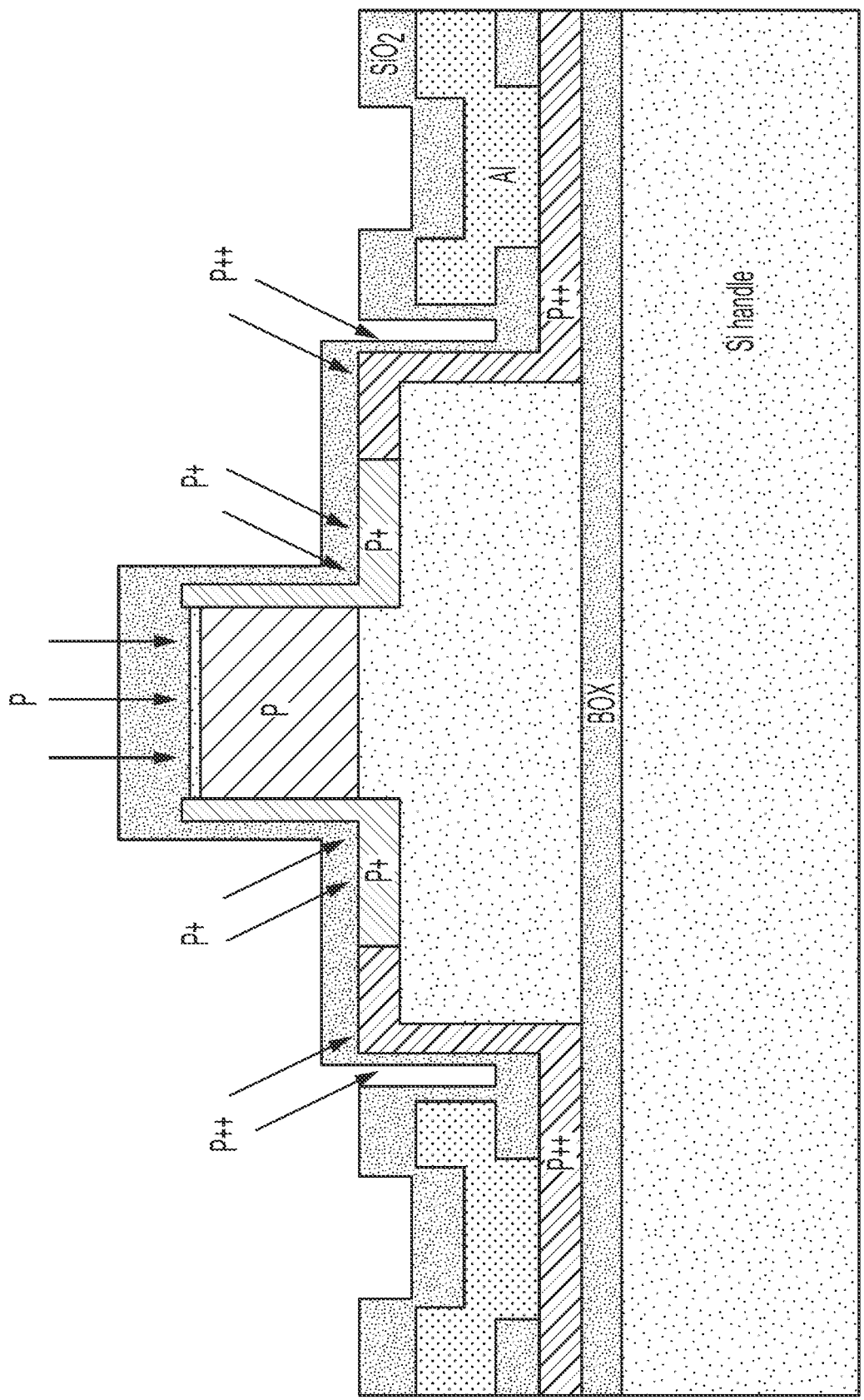
FIG. 2E is a schematic drawing of a waveguide structure showing ion implantation directions, according to an embodiment of the present disclosure.

FIG. 2E shows ion implantation doping steps that may be performed to fabricate the embodiment of FIG. 2A. A suitable mask may be used for each doping step; for example, the regions that are, or will become, the moderately doped regions and the heavily doped regions may be masked off (e.g., with photoresist) while the lightly doped regions are formed (by ion implantation); the top of the waveguide ridge and the regions that are, or will become, the heavily doped regions may be masked off to form the moderately doped regions; and the top of the waveguide ridge and the regions that are, or will become, the moderately doped regions may be masked off to form the heavily doped regions. In another embodiment, all of the regions may be left unmasked when the lightly doped regions are formed by ion implantation, the top of the waveguide ridge may be masked off and the remaining regions may be doped to form the moderately doped regions, and the lightly and moderately doped regions may be masked off to form the heavily doped regions. The doping operations may be performed before or after the transverse trenches 125 forming the grating have been etched. The doping operations may be performed in any order.

Figures 2F, 2G:
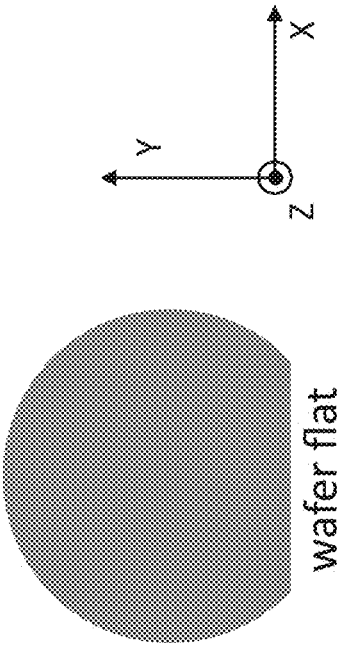
FIG. 2F is a table of doping parameters, according to an embodiment of the present disclosure.
FIG. 2G is a plan view of a wafer, according to an embodiment of the present disclosure.

FIG. 2F shows the dopant (boron), the ion flux (per square cm), the implantation energy and the implantation direction for each of nine implantation operations that may be used to perform the doping. The P-dopant may be boron or BF4. Boron may be well suited to the fabrication of the structure of FIG. 2A (and of other similar structures described herein) because it is a light atom and has relatively large penetration depth, which may be advantageous for implanting dopant at depths of several microns, as for, e.g., the third lightly doped region 3, and for implanting dopant into the sidewall of the waveguide ridge, using only a small implantation tilt angle. Twist is an in-plane angle relative to the axis that is normal to the wafer flat, and tilt is an angle relative to a vector normal to the wafer. The coordinate system for the direction of implantation is defined with respect to the flat edge of the semiconductor wafer (or "wafer flat"), with X being parallel to the flat edge, and Z being perpendicular to the plane of the wafer, as shown in FIG. 2G.

Figure 2H:
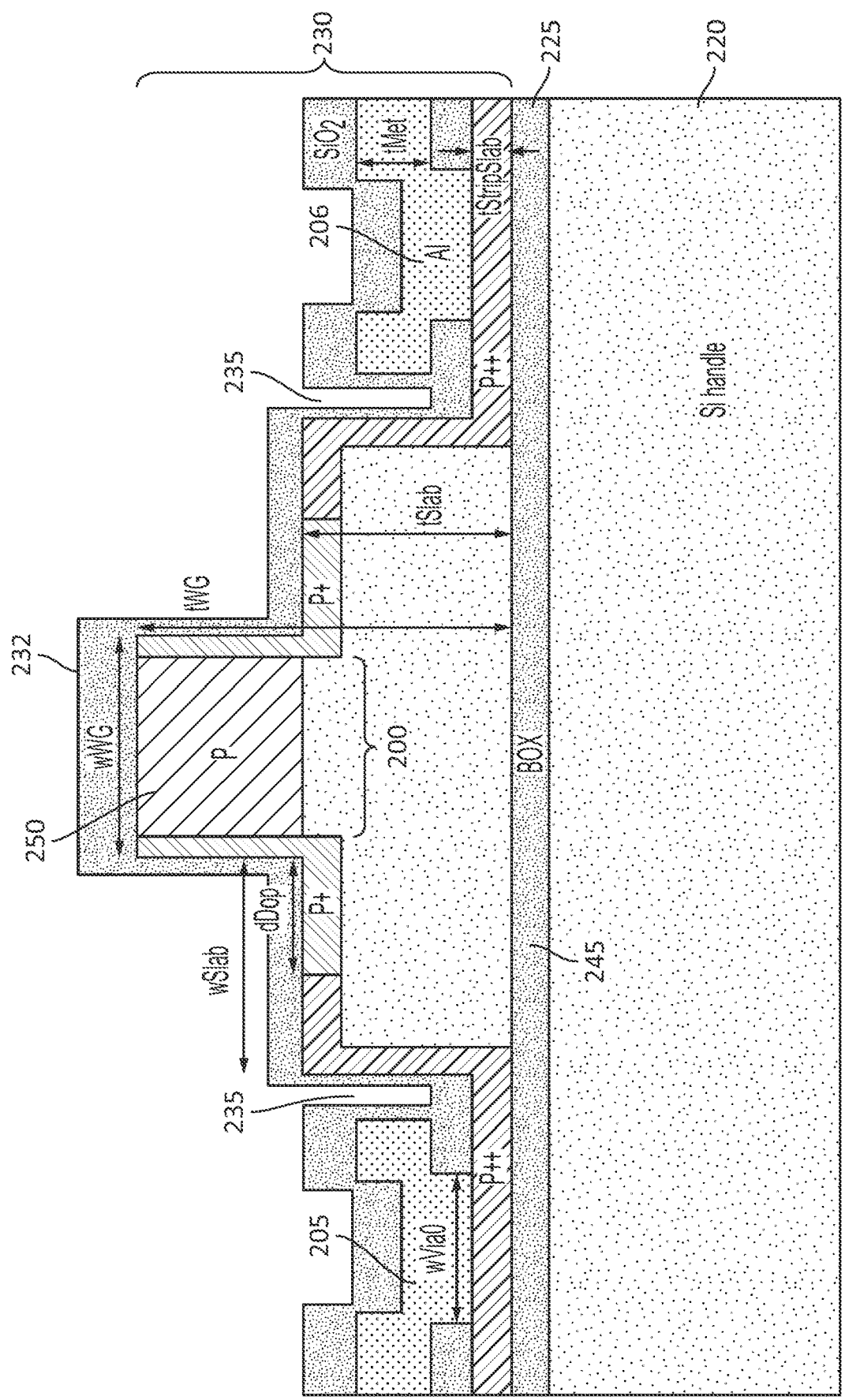
FIG. 2H is a schematic drawing of a waveguide structure, according to an embodiment of the present disclosure.
Figure 2I:
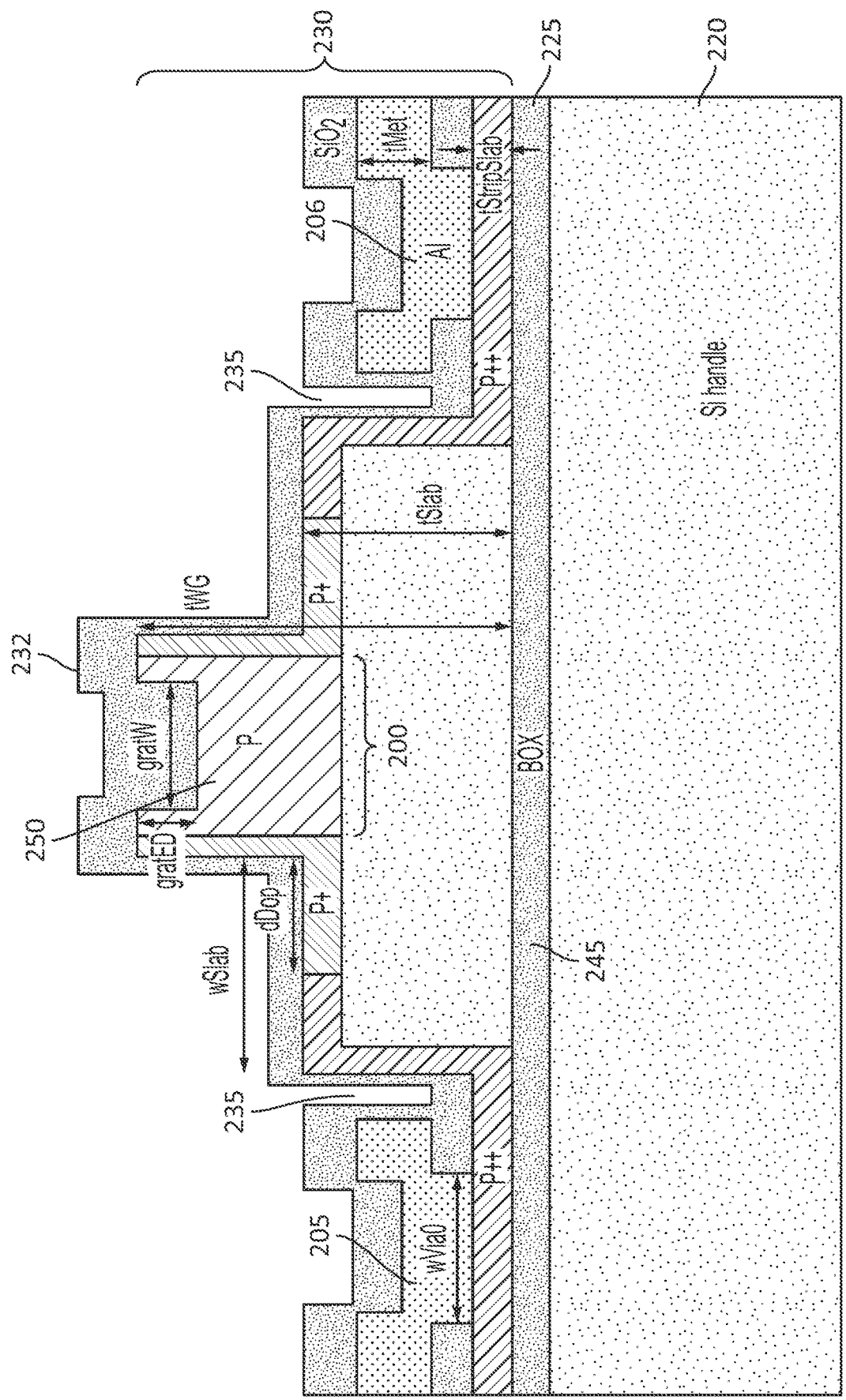
FIG. 2I is a schematic drawing of a waveguide structure, according to an embodiment of the present disclosure.

FIG. 2H is a cross-sectional view of the embodiment of FIGS. 2A and 2B, taken at a cutting plane that is perpendicular to the waveguide and that is between two of the trenches 125 used to form the grating. The waveguide may include a slab 245, and, protruding above the top surface of the slab 245, a waveguide ridge 250. The slab 245 may be sufficiently thick to significantly affect the shape of the modes of the waveguide; such a waveguide may be referred to as a "rib" waveguide, and, in such an embodiment, the waveguide ridge 100 may also be referred to as a "rib". FIG. 2I is a cross-sectional view of the embodiment of FIGS. 2A and 2B, taken at a cutting plane that is perpendicular to the waveguide and that passes through one of the trenches 125 used to form the grating. The dimensions identified in FIGS. 2H and 2I are listed in the table of FIG. 2C.

Figure 2J:
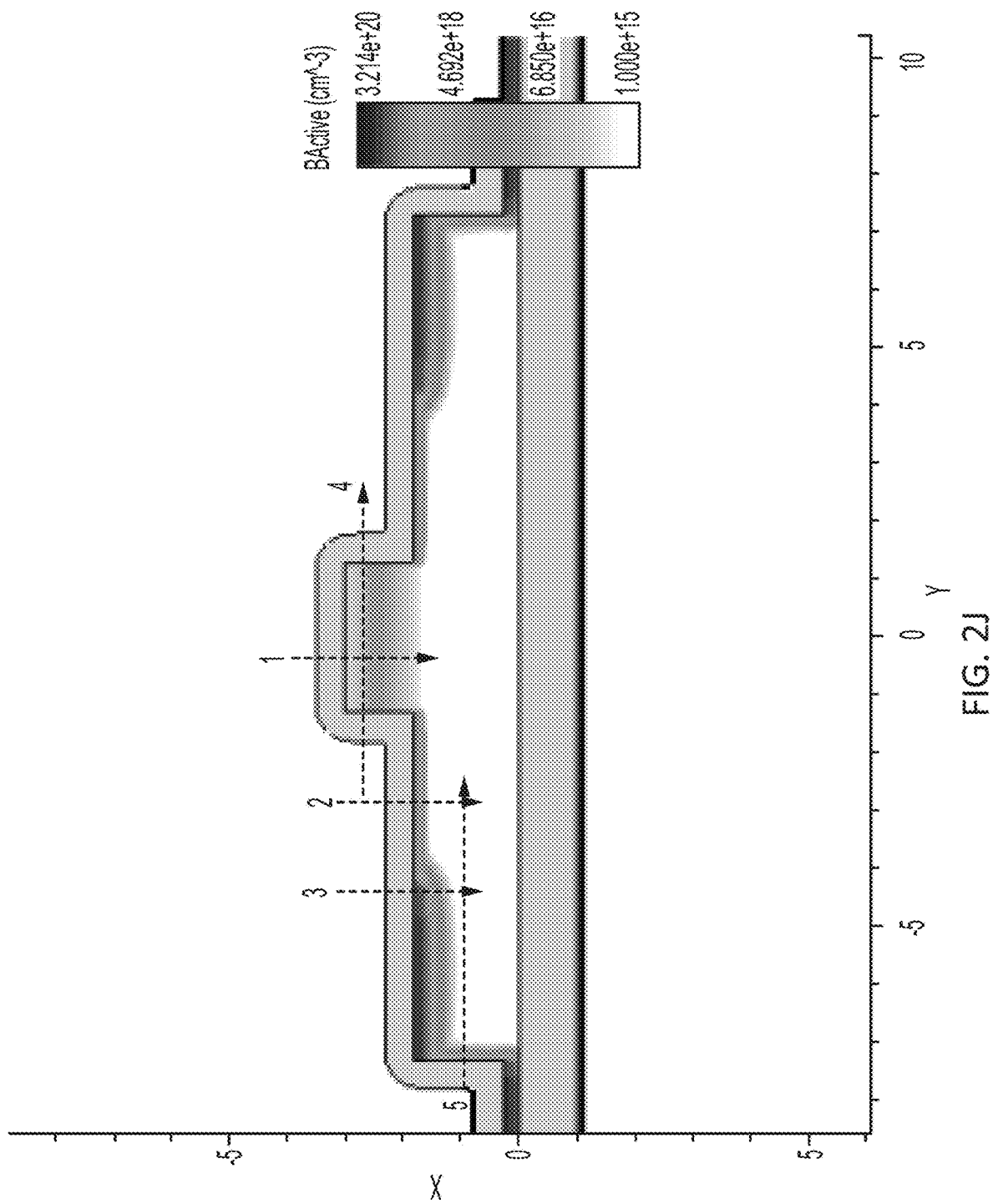
FIG. 2J is a graph of doping concentrations, according to an embodiment of the present disclosure.
Figure 2K:
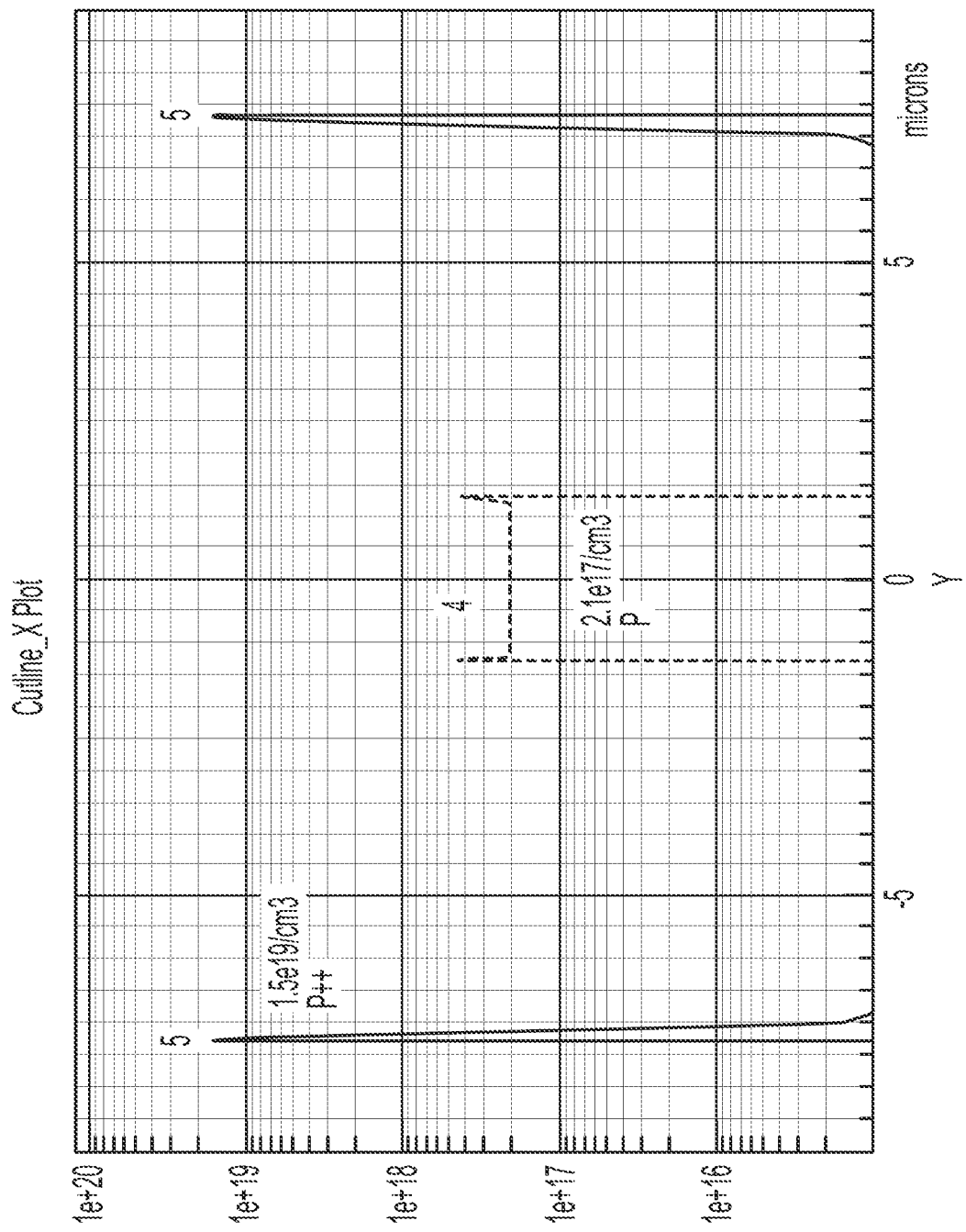
FIG. 2K is a graph of doping concentrations, according to an embodiment of the present disclosure.
Figure 2L:
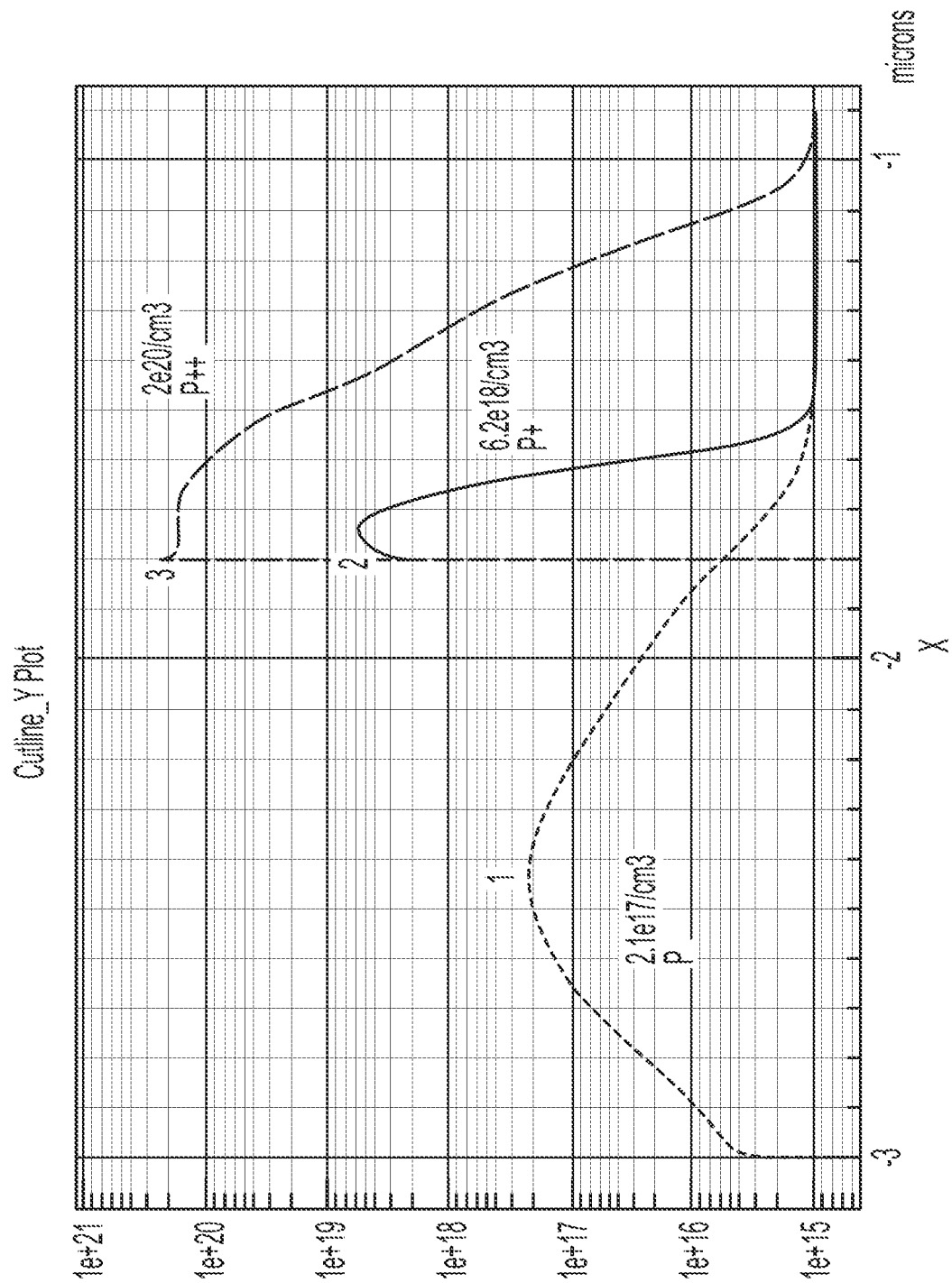
FIG. 2L is a graph of doping concentrations, according to an embodiment of the present disclosure.
Figure 2M:
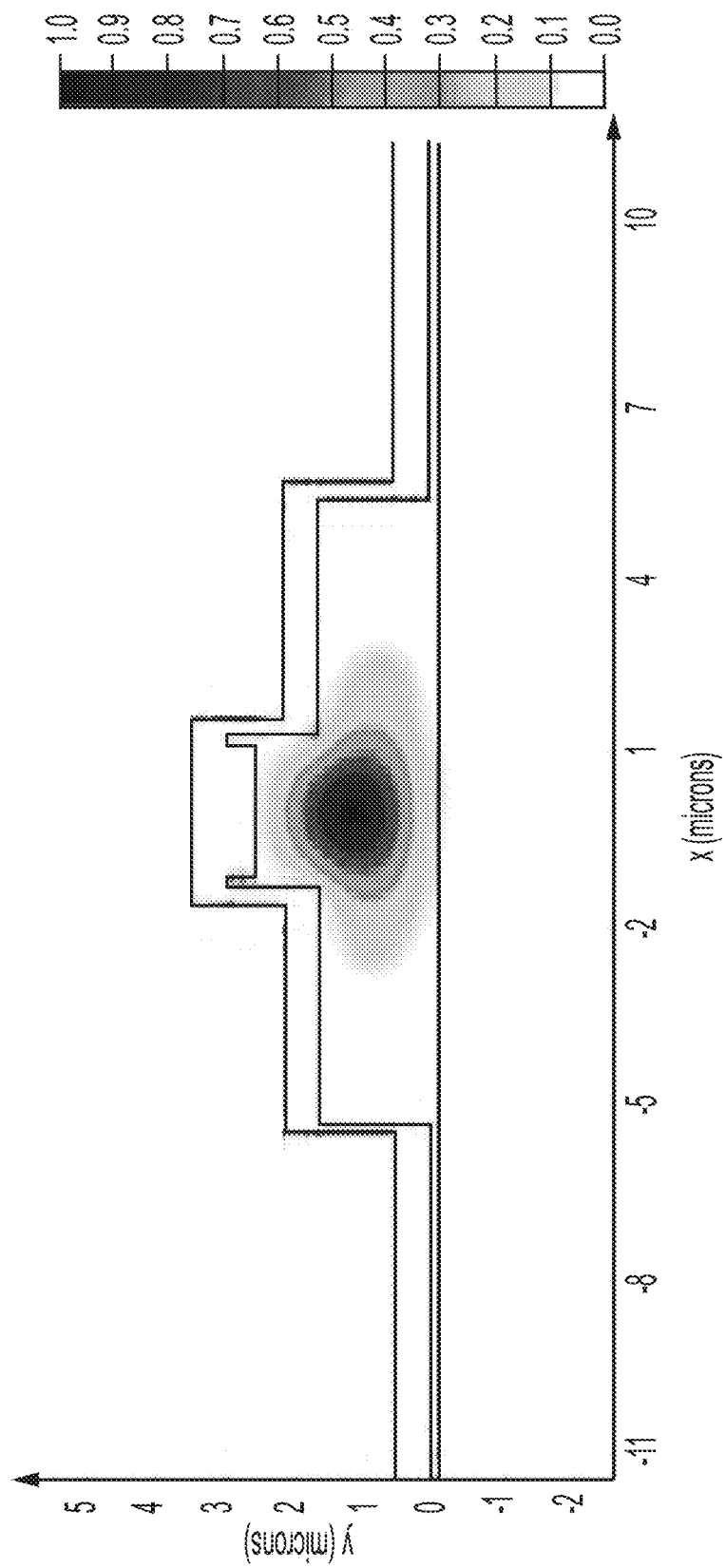
FIG. 2M is a graph of optical power density, according to an embodiment of the present disclosure.
Figure 2N:
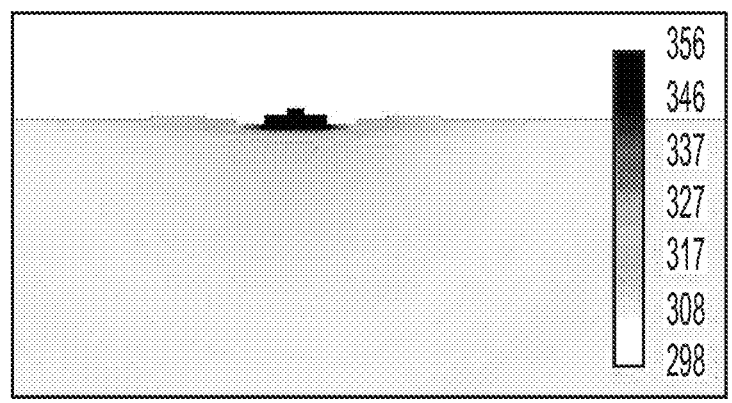
FIG. 2N is a graph of temperature, according to an embodiment of the present disclosure.
Figure 2O:
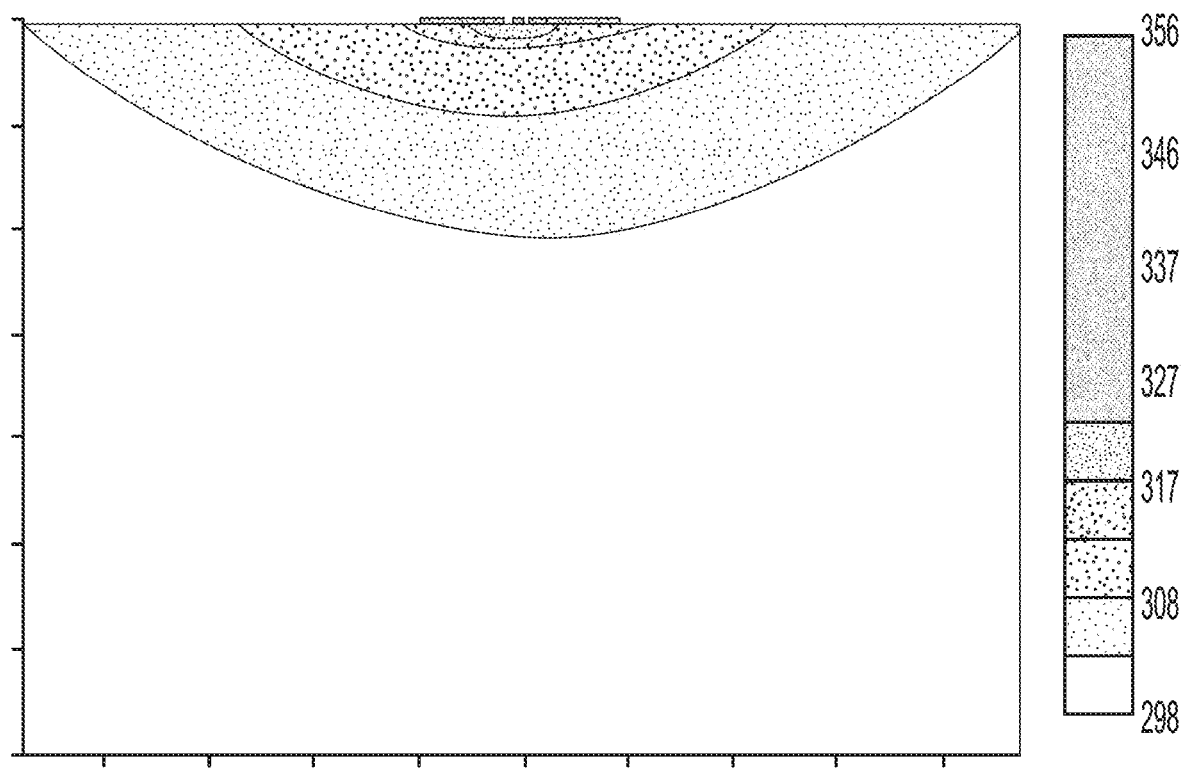
FIG. 2O is a graph of temperature, according to an embodiment of the present disclosure.

FIG. 2J shows the doping concentration in the waveguide structure, in some embodiments, and FIGS. 2K and 2L show graphs of doping concentration along lines numbered 1 through 5 and shown in FIG. 2J. FIG. 2M is a graph of the optical power density distribution in the waveguide. FIGS. 2N and 2O show the simulated temperature profile for a 1 mm long heater with a voltage drop of 3V across the heating element, when the bottom surface of the (700 um thick) substrate is at a temperature of 298 K. The buried oxide layer 225 may provide a significant amount of insulation, as may be seen from the relatively large thermal gradient in the vertical direction. In some embodiments the buried oxide layer 225 may be removed to undercut the waveguide and provide a still more effective thermal barrier.

Figure 2P:
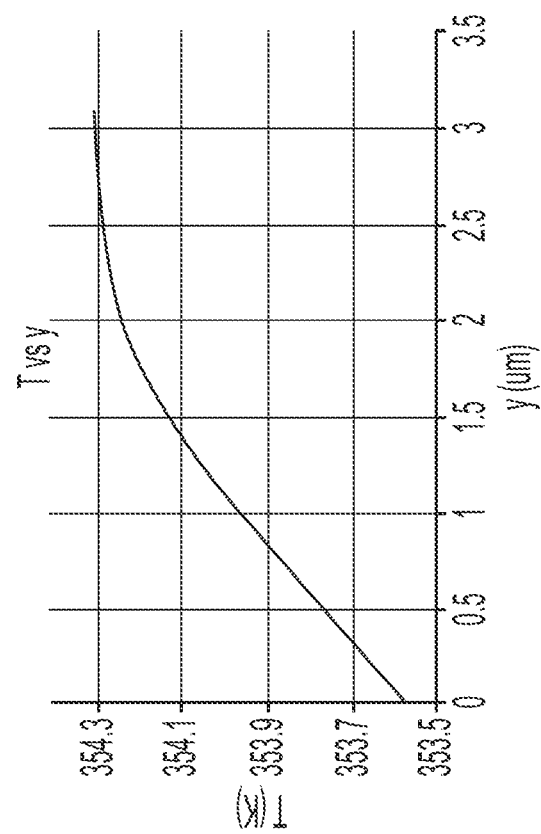
FIG. 2P is a graph of temperature, according to an embodiment of the present disclosure.

FIG. 2P shows the temperature as a function of height (Y, defined in FIG. 2A) within the waveguide. It may be seen from FIG. 2P that the temperature is highly uniform within the waveguide. In some embodiments, the temperature profile may differ to some extent from that illustrated in FIGS. 2N-2P. In some embodiments (according to FIGS. 2A and 2B, or according to other embodiments discussed below, e.g., the embodiment of FIGS. 3A and 3B, the embodiment of FIG. 4A, or the embodiment of FIGS. 5A and 5B), the temperature is uniform to within (i.e., varies less, within the waveguide, than) 30 degrees C. (e.g., it varies within the waveguide (i) by less than 15 degrees, e.g., by less than 3 degrees, or (ii) by less than a value between 0 degrees and 30 degrees). The table of FIG. 2Q shows performance characteristics of the heater at three different wavelengths and corresponding grating lengths ($L_{grat}$ or "DBR Length"). For example, the minimum temperature within the waveguide, in steady state operation with a voltage of 3 V between the first contact and the second contact, may be greater by at least 20 degrees C. (or greater by a value between 1 degree and 100 degrees C.), e.g., greater by at least 40 degrees C., than the minimum temperature within the waveguide, in steady state operation with a voltage of 0 V between the first contact and the second contact. The dimensions $w_{Slab}$ and $d_{Dop}$ are shown in FIG. 2A; the efficiency is defined as the product of the length of the heated section and the temperature change, divided by the heating power applied. In some embodiments the time constant of the heater (i.e., the time constant relating a change in heater current to a corresponding change in the temperature of the waveguide) may be less than 1,000 microseconds (us), e.g., (i) less than 10 us, e.g., about 5 us, or (ii) less than a number between 0 microseconds and 1,000 microseconds.

In some embodiments, the insertion loss (IL) is less than 1 dB/mm (e.g., (i) less than 0.5 dB/mm, e.g., less than 0.2 dB/mm, or (ii) less than a value between 0.0 dB/mm and 2.0 dB/mm) for each of the three wavelengths. The wavelength shift listed in the table of FIG. 2Q is the maximum laser wavelength shift (e.g., the wavelength change of the reflectivity peak of the Bragg grating) when 3 V is applied to the heater. In some embodiments, the wavelength of the reflectivity peak in steady state operation, with a voltage of 3 V between the first contact and the second contact, is greater than the wavelength of the reflectivity peak in steady state operation, with a voltage of 0 V between the first contact and the second contact, by at least 0.1 nm, e.g., (i) by at least 1 nm, or (ii) by at least a value between 0.01 and 5.00 nm. In some embodiments, the power dissipated in the heater with a voltage of 3 V between the first contact and the second contact, is less than 1 W, e.g., less than 250 mW, or less than a value between 0.010 W and 1.00 W.

Figure 3A:
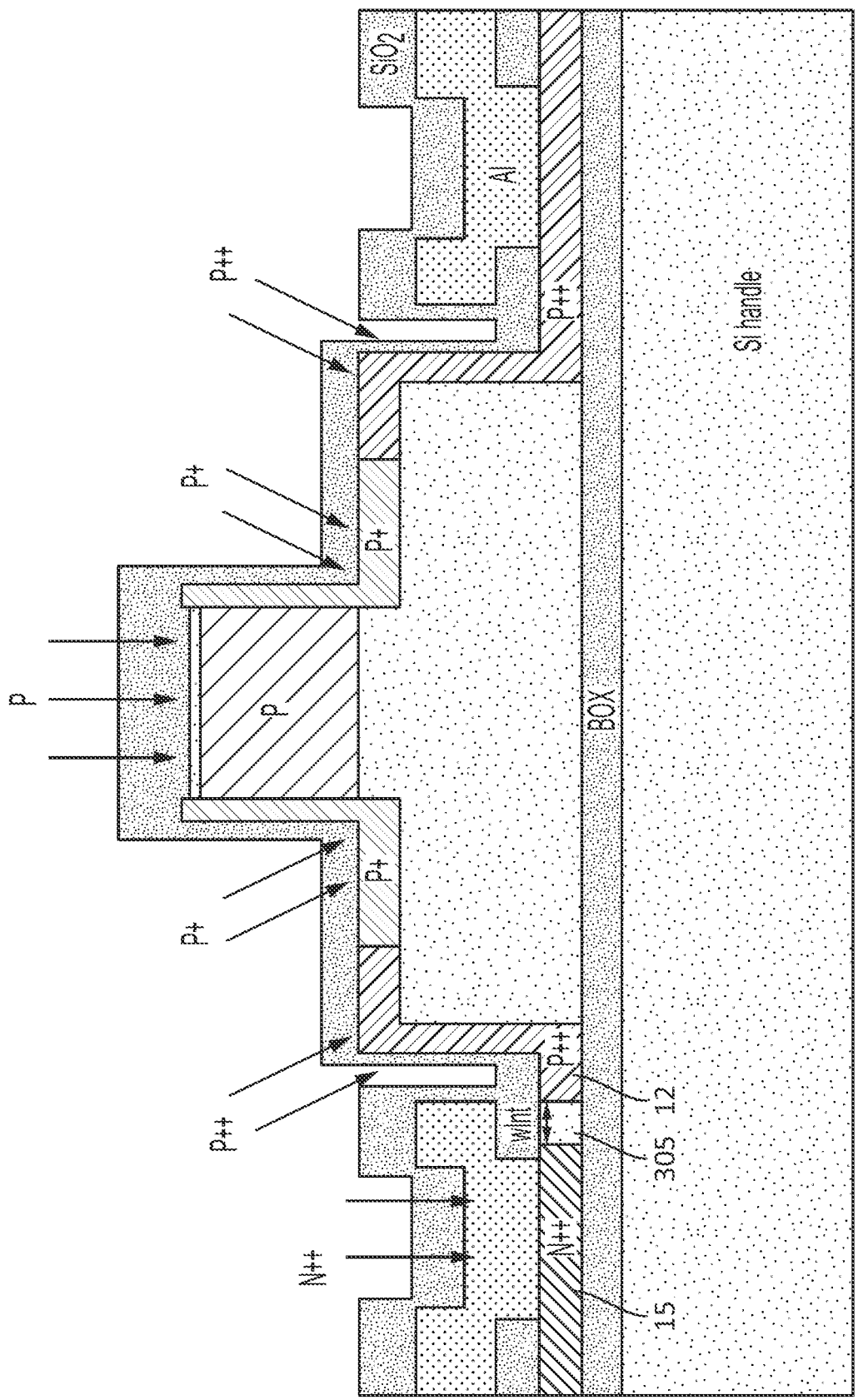
FIG. 3A is a schematic drawing of a waveguide structure, according to an embodiment of the present disclosure.
Figure 3B:
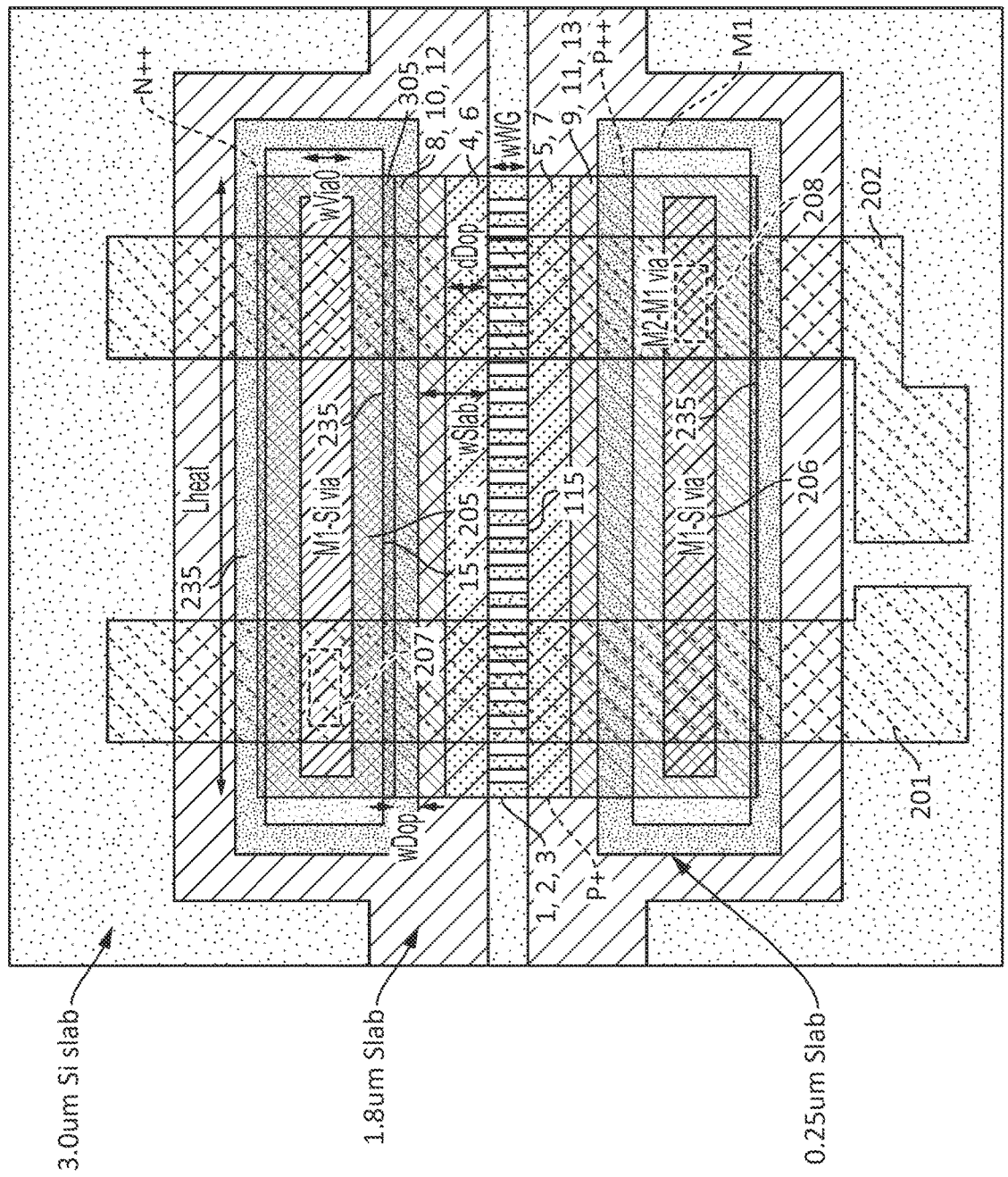
FIG. 3B is a schematic drawing of a waveguide structure, according to an embodiment of the present disclosure.

In some embodiments, a heater is fabricated with a series diode, to make possible the driving of an array of heaters through a reduced number of wires. FIG. 3A shows an example of such an embodiment, in which a PIN (P-type–intrinsic–N-type) diode is formed from (i) an N++ doped region 15 under the metal to silicon via 205 of the first low-resistance path, (ii) the first highly doped (P++ doped) region 12 of the first low-resistance path, and (iii) a gap 302 (with intrinsic silicon) between the N++ doped region 15 and the adjacent P++ doped region 12. This PIN diode is connected in series with the heater. FIG. 3B shows a top view of this embodiment. Dimensions identified in FIG. 3A are listed in the table of FIG. 3C.

Figure 3D:
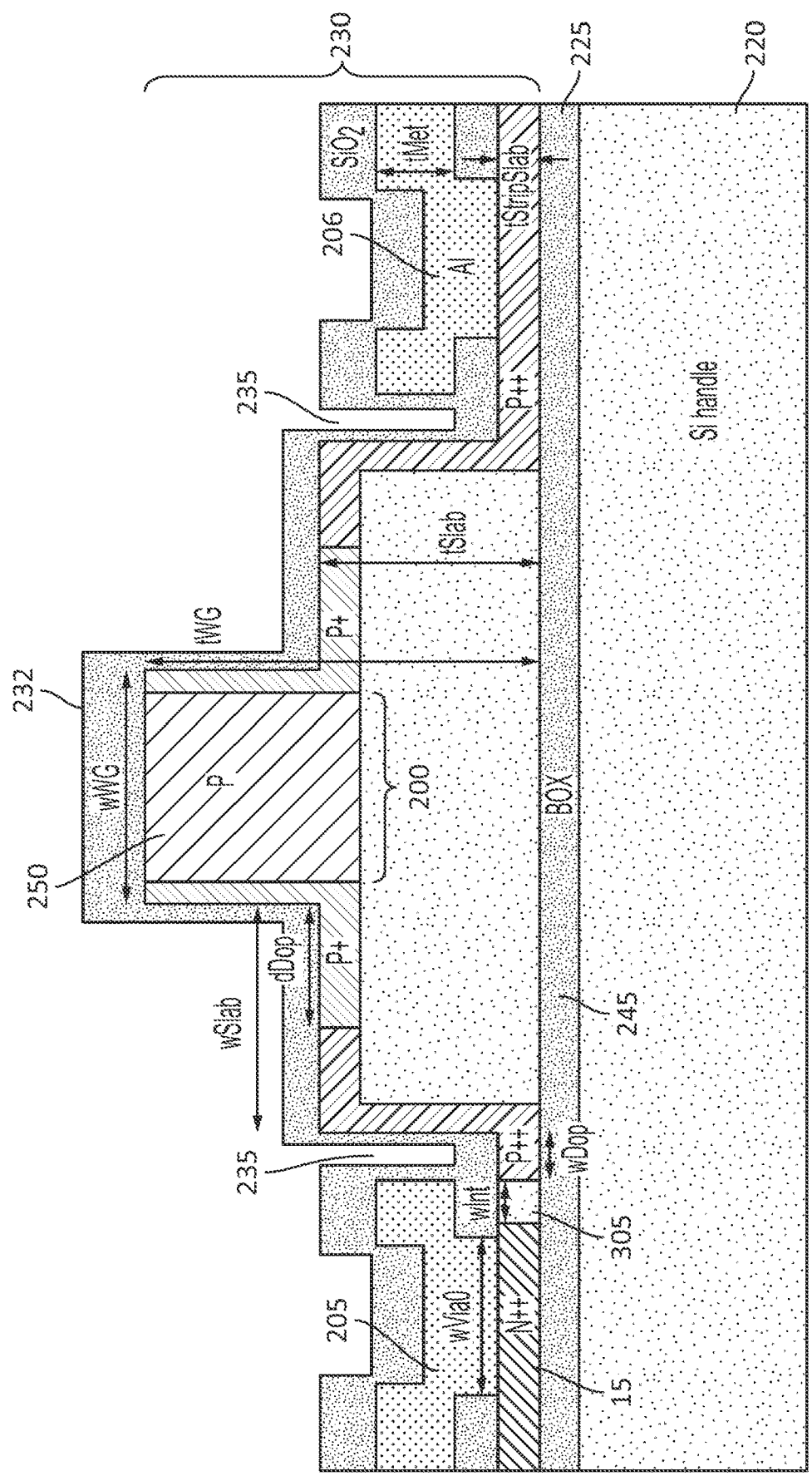
FIG. 3D is a schematic drawing of a waveguide structure, according to an embodiment of the present disclosure.
Figure 3E:
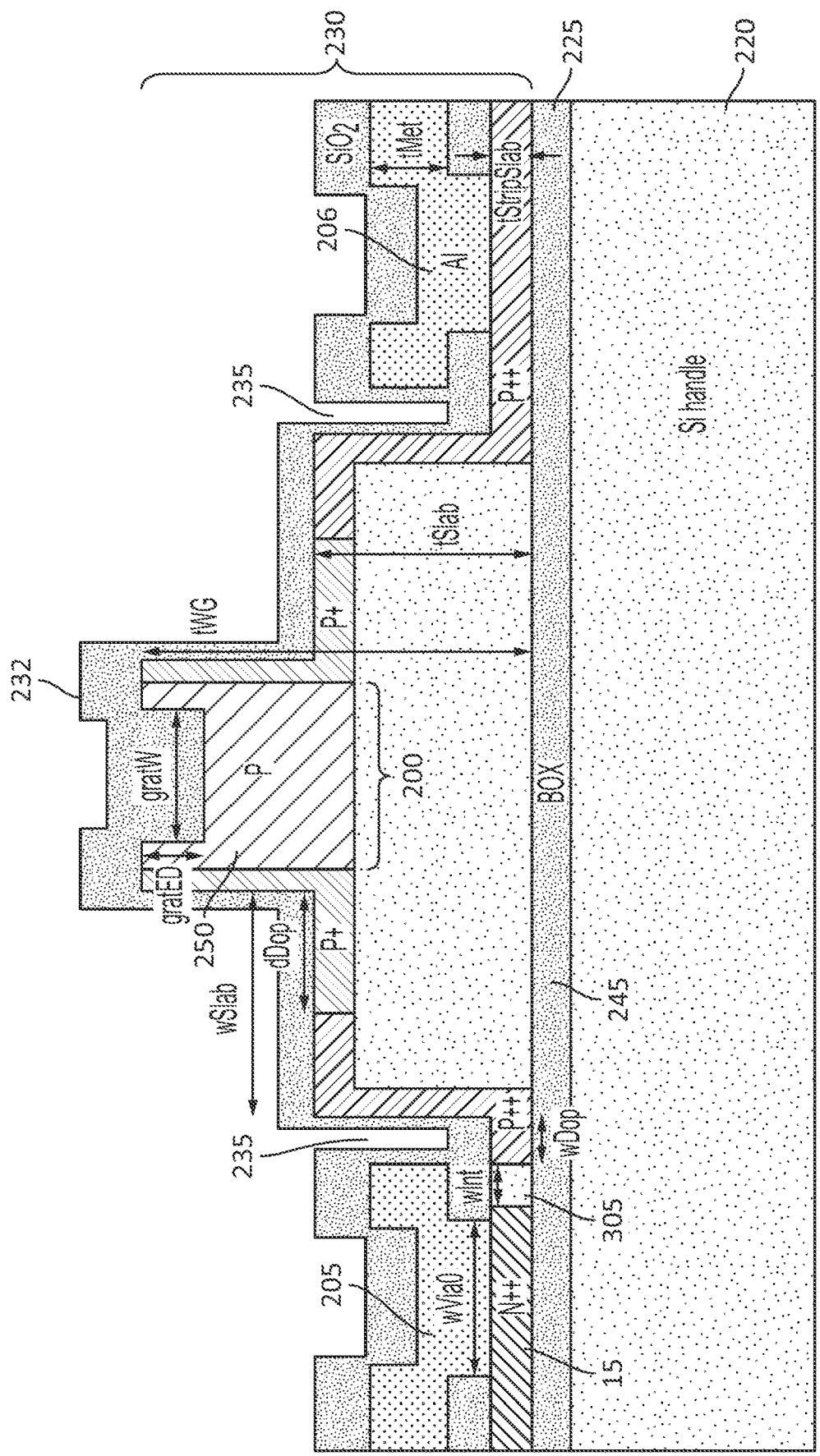
FIG. 3E is a schematic drawing of a waveguide structure, according to an embodiment of the present disclosure.

FIG. 3D is a cross-sectional view of the embodiment of FIGS. 3A and 3B, taken at a cutting plane that is perpendicular to the waveguide and that is between two of the trenches 125 used to form the grating. FIG. 3E is a cross-sectional view of the embodiment of FIGS. 2A and 2B, taken at a cutting plane that is perpendicular to the waveguide and that passes through one of the trenches 125 used to form the grating. The dimensions identified in FIGS. 3D and 3E are listed in the table of FIG. 3C.

Figure 3F:
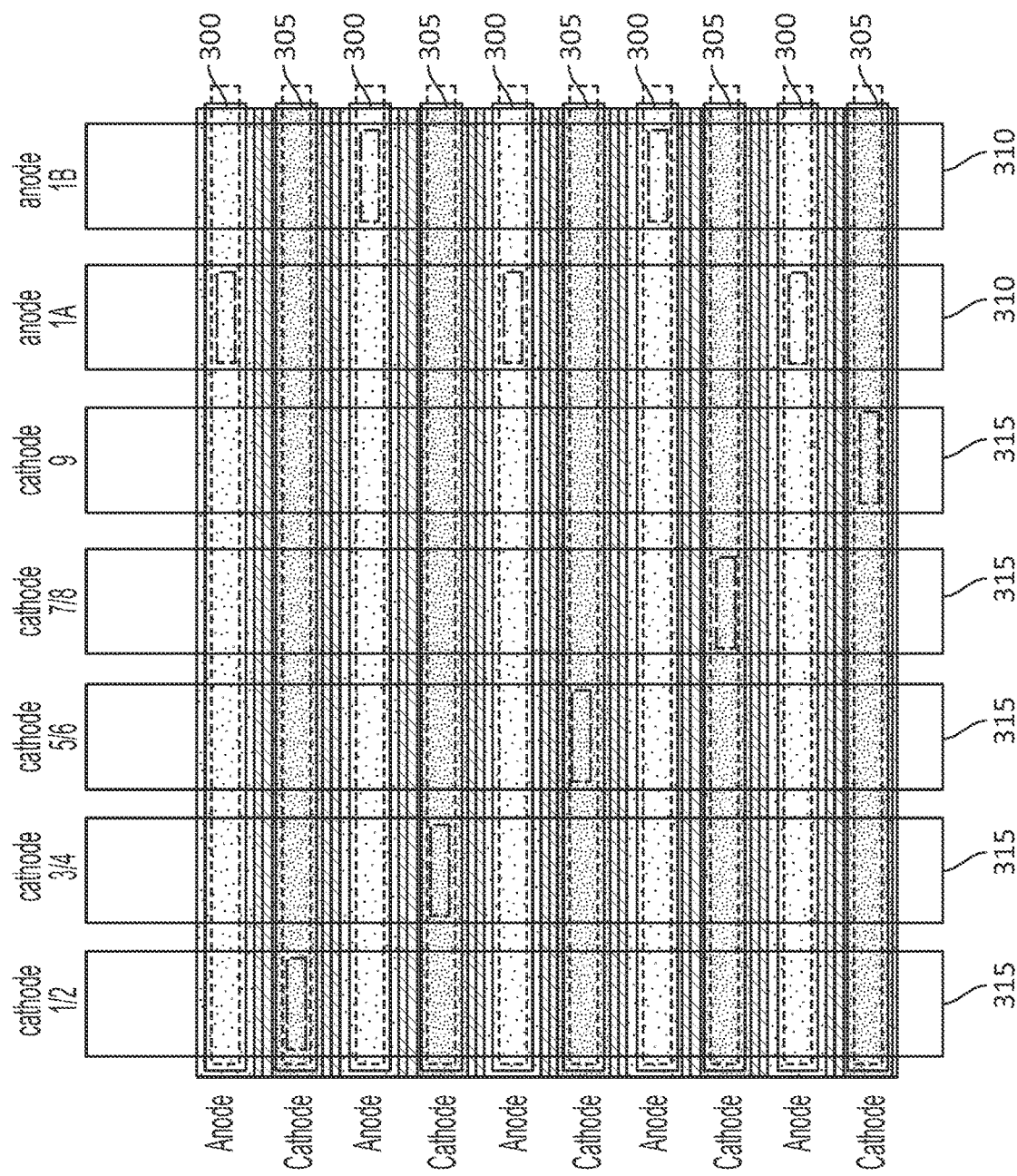
FIG. 3F is a plan view of an array of waveguide heaters, according to an embodiment of the present disclosure.
Figure 3G:
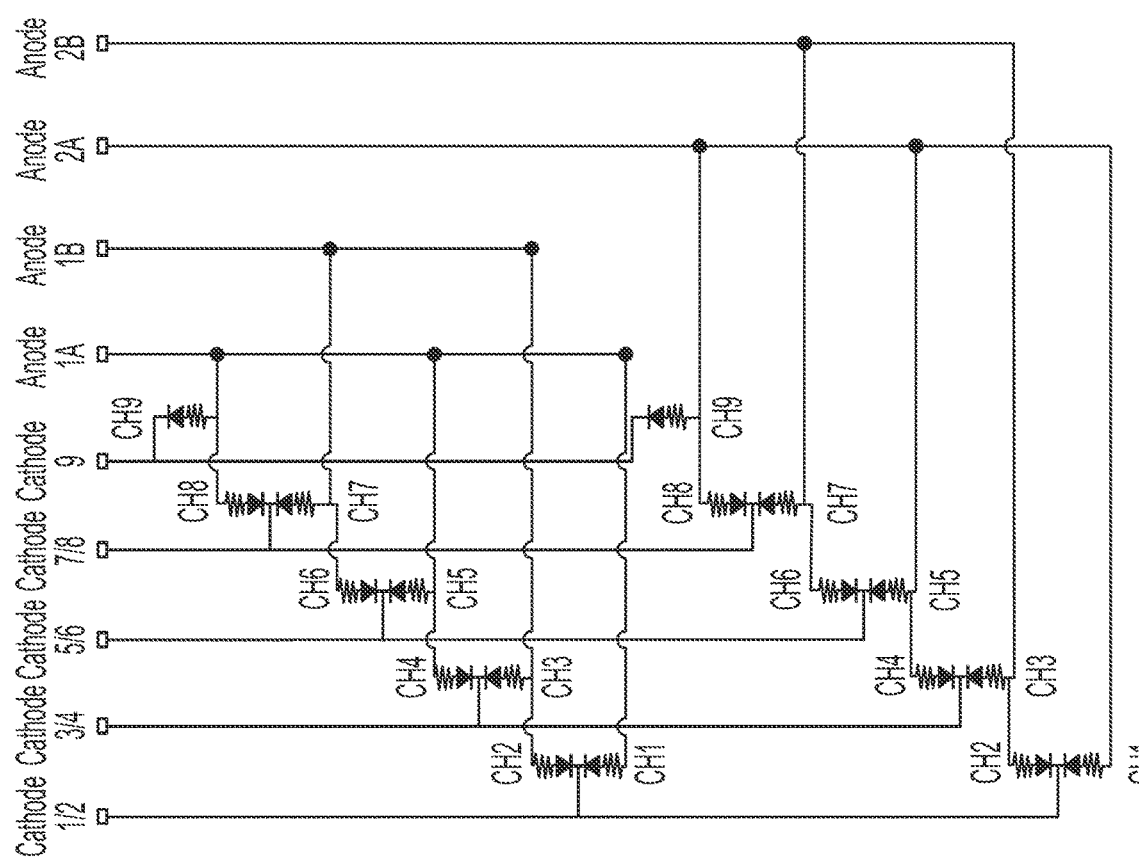
FIG. 3G is a schematic diagram showing connections to an array of heaters, according to an embodiment of the present disclosure.

FIG. 3F is a top view of an array of heaters, each being between an anode 300 and a cathode 305, each anode being a P++ doped region to which a metal anode drive conductor 310 is connected through a respective metal to silicon via, and each cathode being an N++ doped region to which a metal cathode drive conductor 315 is connected through a respective metal to silicon via. The drive conductors may be metal wires, e.g., wires formed in the second layer of metal. Current may be driven through any one of the heaters by applying a positive voltage to the anode drive conductor 310 connected to the anode of the heater and applying a negative voltage to the cathode drive conductor 315 connected to the cathode of the heater. In the embodiment of FIG. 3F, any one of the nine heaters may be individually driven, and this capability is accomplished with a total of seven drive conductors; ten conductors would have been used instead if, for example, each heater were connected between one dedicated anode drive conductor and a common ground. Moreover, as the schematic diagram of FIG. 3G shows, this design may be extended, to, for example, a circuit in which each of 18 heaters may be may be individually driven using nine drive conductors (instead of the 19 that would be used if each heater were connected between one dedicated drive conductor and a common ground). In general, in this approach M×N heaters may be driven using ceil(M/2)+2N drive conductors; for example, for 90 heaters, the heaters may be grouped as 5 groups of 18 (N=5 and M=18) resulting in 19 drive conductors (as opposed to the 91 conductors that would be employed if each heater were connected between one dedicated drive conductor and a common ground. In some embodiments, the heaters are instead grouped as 9 groups of 10 or as 10 groups of 9. In some embodiments, Schottky diodes are used instead of PIN diodes, to reduce the voltage drop across (and the power dissipation in) each diode.

In operation, the diode of the embodiment of FIGS. 3A and 3B may incur a voltage drop (e.g., of 0.7 V), resulting in (i) a higher drive voltage being required to achieve the same temperature, and (ii) reduced efficiency (except to the extent that the diode is sufficiently close to the waveguide to heat it as effectively as the heating element does), because some of the electrical power delivered to the circuit is dissipated in the diode. FIG. 3H shows performance characteristics of a heater with a series diode. It may be seen that the wavelength shift achieved is about half of that for an embodiment lacking a series diode (performance characteristics for which are shown in the table of FIG. 2Q). The presence of the diode may have little effect on the speed of the heater, because the RC time constant of the diode heater may be at least an order of magnitude smaller than the thermal time constant of the waveguide structure (which may be, e.g., within 50% of 5 us (microseconds)).

A heater similar to those of the embodiments of FIGS. 2A and 2B, and of FIGS. 3A and 3B may also be employed to heat a waveguide lacking a grating. In such an embodiment the waveguide structure may operate as a waveguide phase shifter. The design of such a waveguide phase shifter, which may be a non-resonant device, may be less constrained than the design of a heater for a grating in a DBR laser, in which it may be advantageous for the waveguide to support only a few transverse modes, to avoid perturbations of the DBR resonance.

Figure 4A:
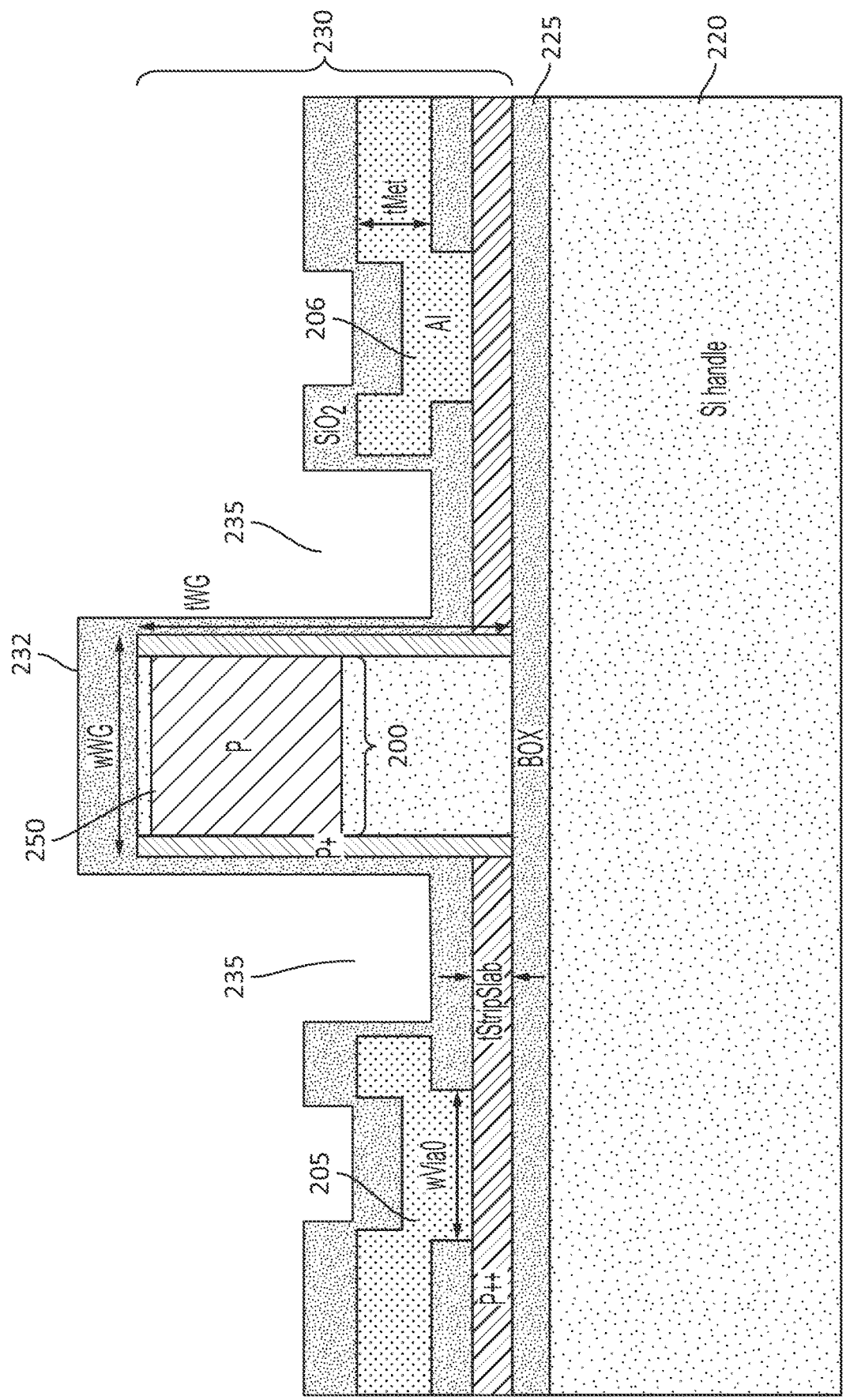
FIG. 4A is a schematic drawing of a waveguide structure, according to an embodiment of the present disclosure.
Figure 4B:
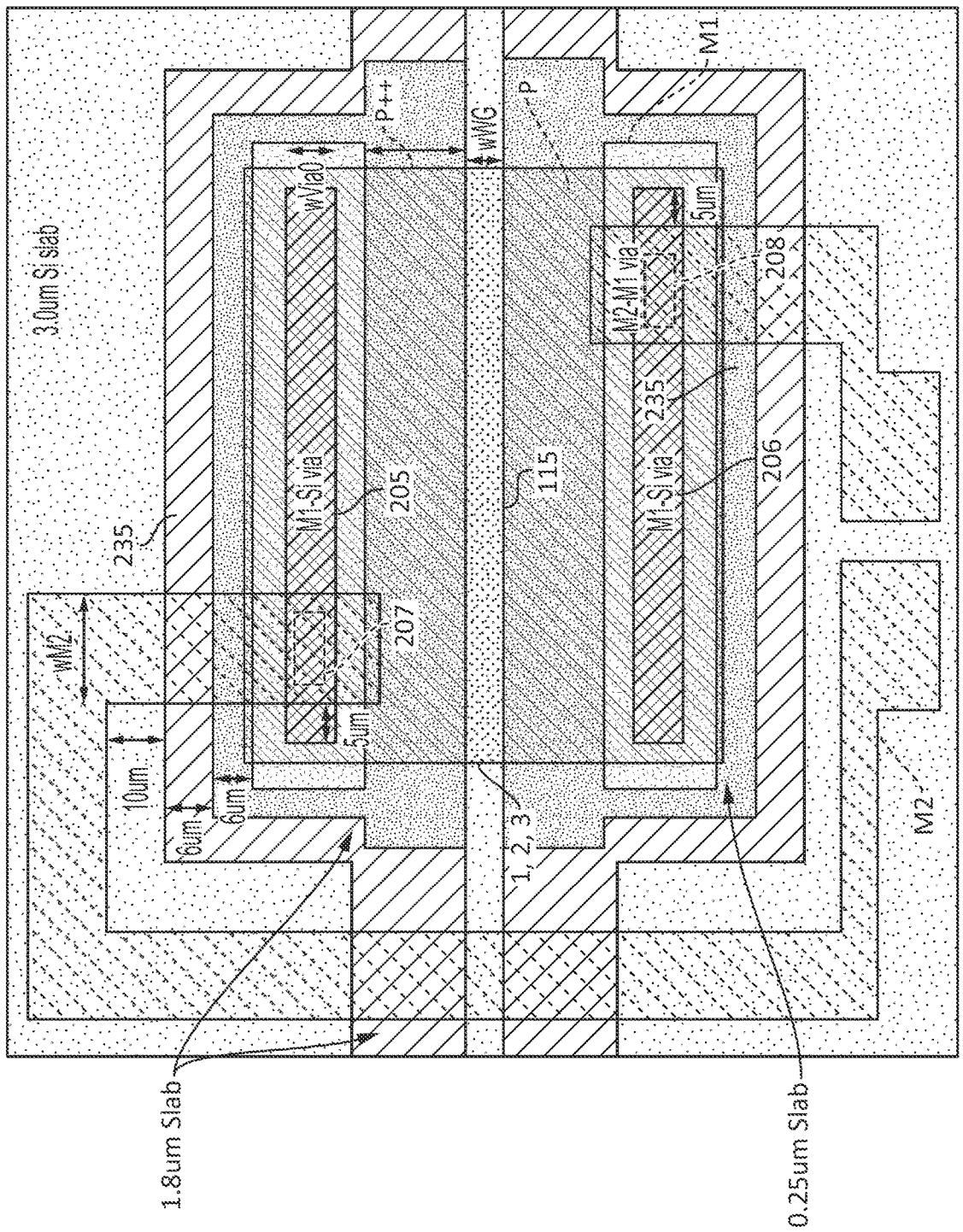
FIG. 4B is a schematic drawing of a waveguide structure, according to an embodiment of the present disclosure.

FIG. 4A shows a cross-sectional view of such a waveguide phase shifter. In the embodiment illustrated, the slab is sufficiently thin that it does not significantly change the shape of fundamental modes (e.g., a TE00 mode and a TM00 mode) that may propagate in the waveguide, and, as such, the waveguide of this embodiment may be referred to as a "strip" waveguide. FIG. 4B shows a top view of this embodiment. Dimensions for this embodiment are shown in the table of FIG. 4C.

Figure 4D:
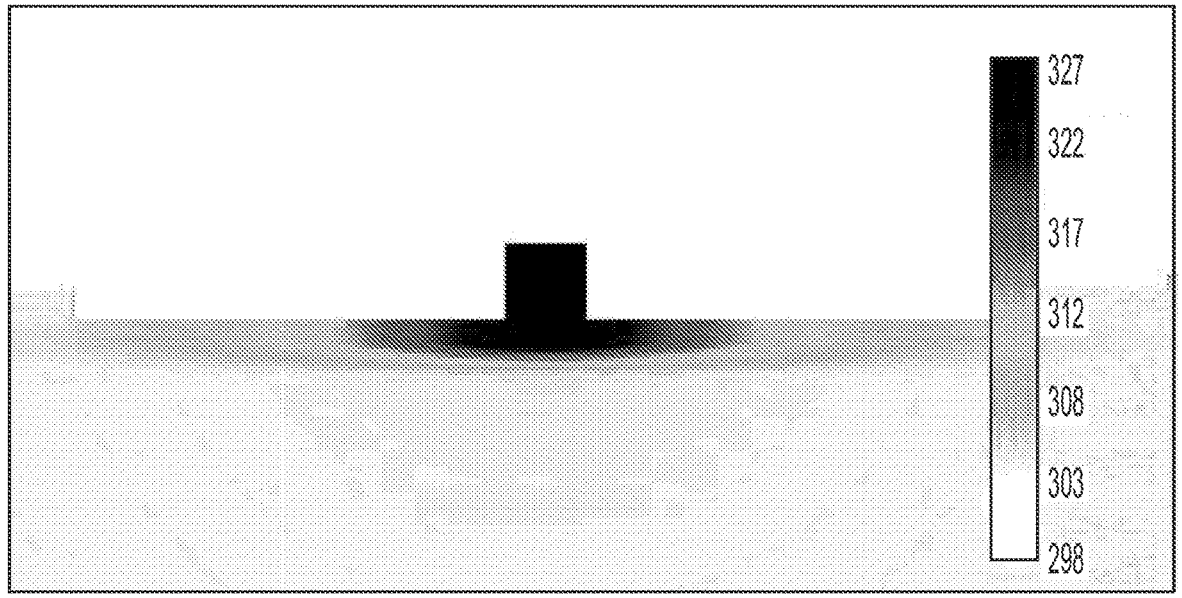
FIG. 4D is a graph of temperature, according to an embodiment of the present disclosure.
Figure 4E:
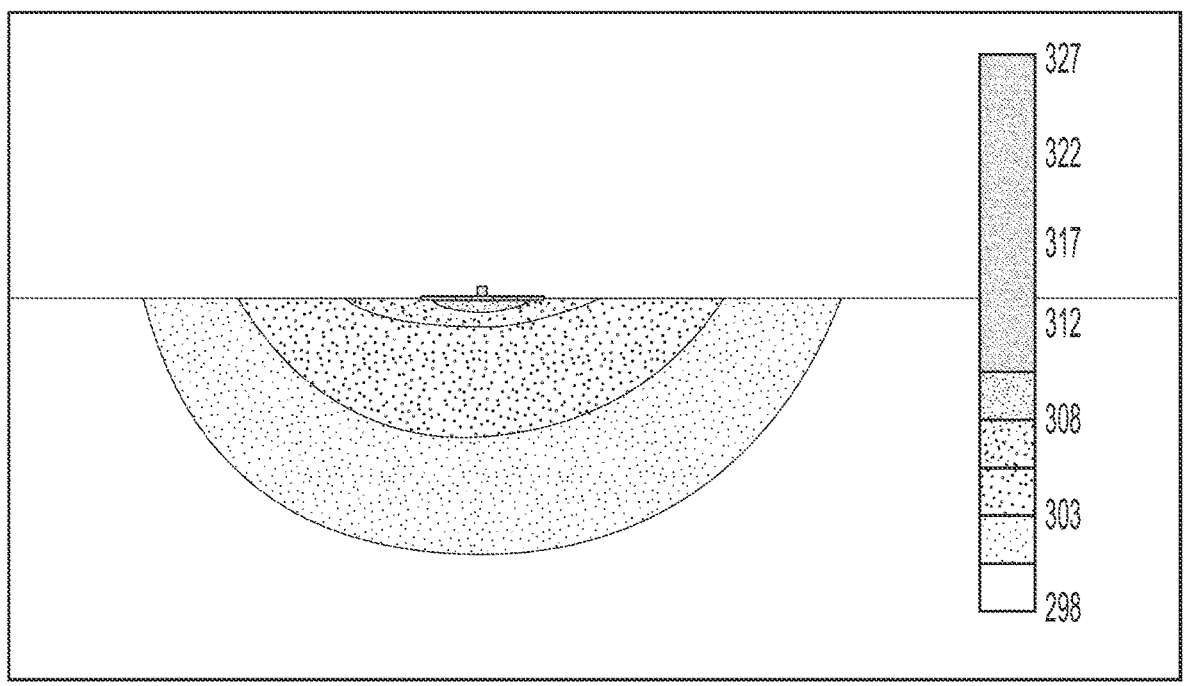
FIG. 4E is a graph of temperature, according to an embodiment of the present disclosure.
Figure 4F:
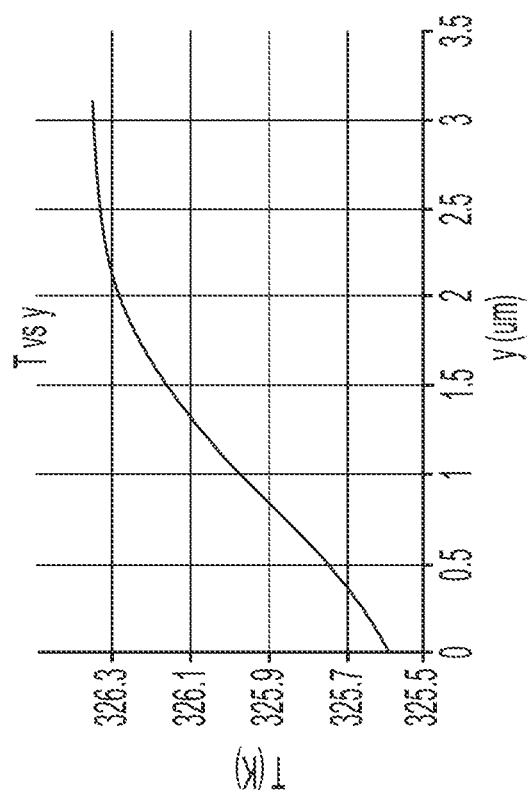
FIG. 4F is a graph of temperature, according to an embodiment of the present disclosure.

FIGS. 4D and 4E show the simulated temperature profile for a 1 mm long heater with a voltage drop of 3V across the heating element, when the bottom surface of the (700 um thick) substrate is at a temperature of 298 K. FIG. 4F shows the temperature as a function of height (Y, defined as the height above the top surface of the BOX layer) within the waveguide. It may be seen from FIG. 4F that the temperature is highly uniform within the waveguide. The table of FIG. 4G shows performance characteristics of the heater for two different lengths and corresponding phase shifter lengths. The table shows the power (Ppi), voltage (Vpi) and current (Ipi) corresponding to a phase shift of pi radians. In some embodiments, the performance characteristics are not precisely those shown but each of the power (Ppi), voltage (Vpi) and current (Ipi) corresponding to a phase shift of pi radians is between half the value shown and twice the value shown.

Figure 5A:
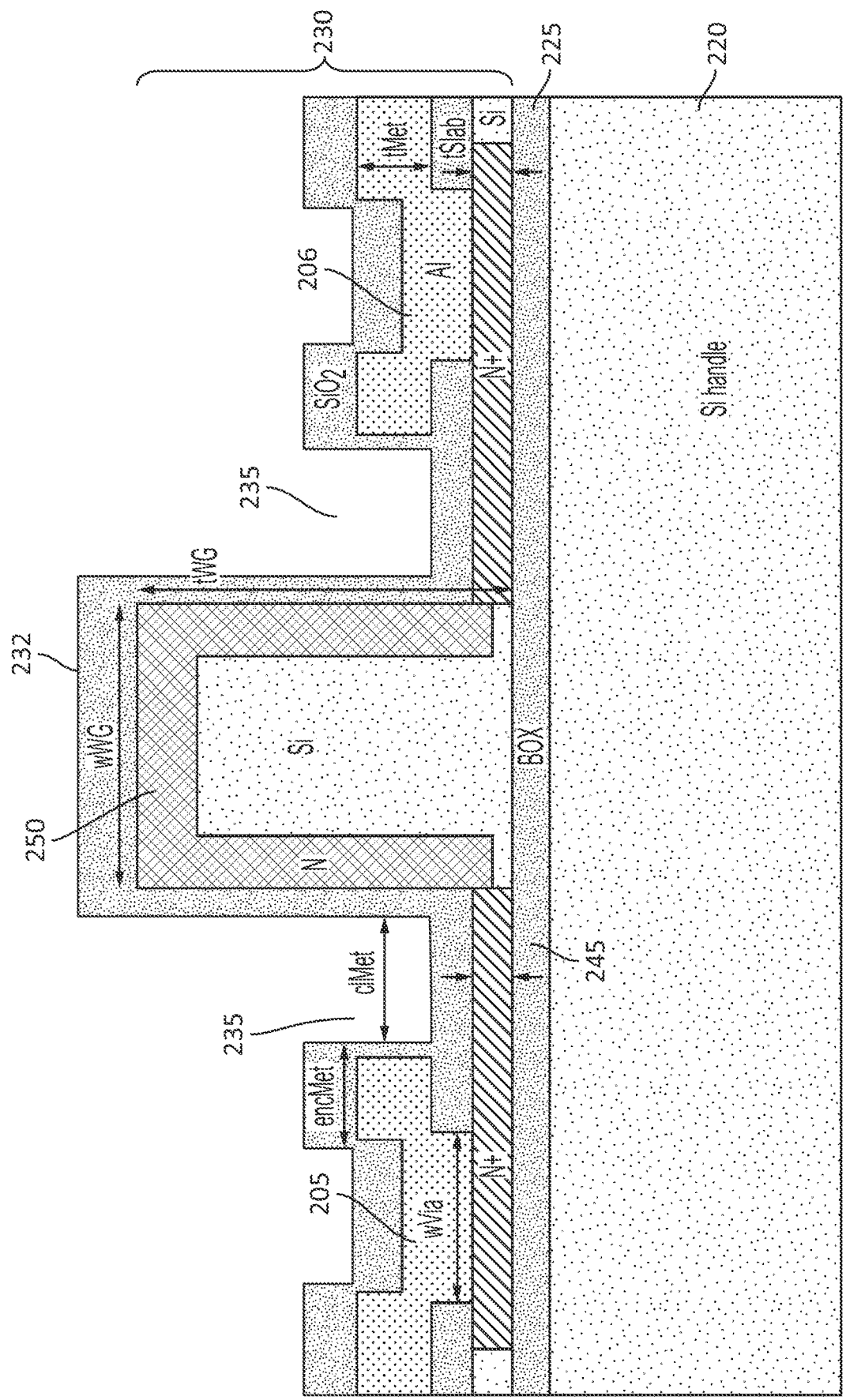
FIG. 5A is a schematic drawing of a waveguide structure, according to an embodiment of the present disclosure.
Figure 5B:
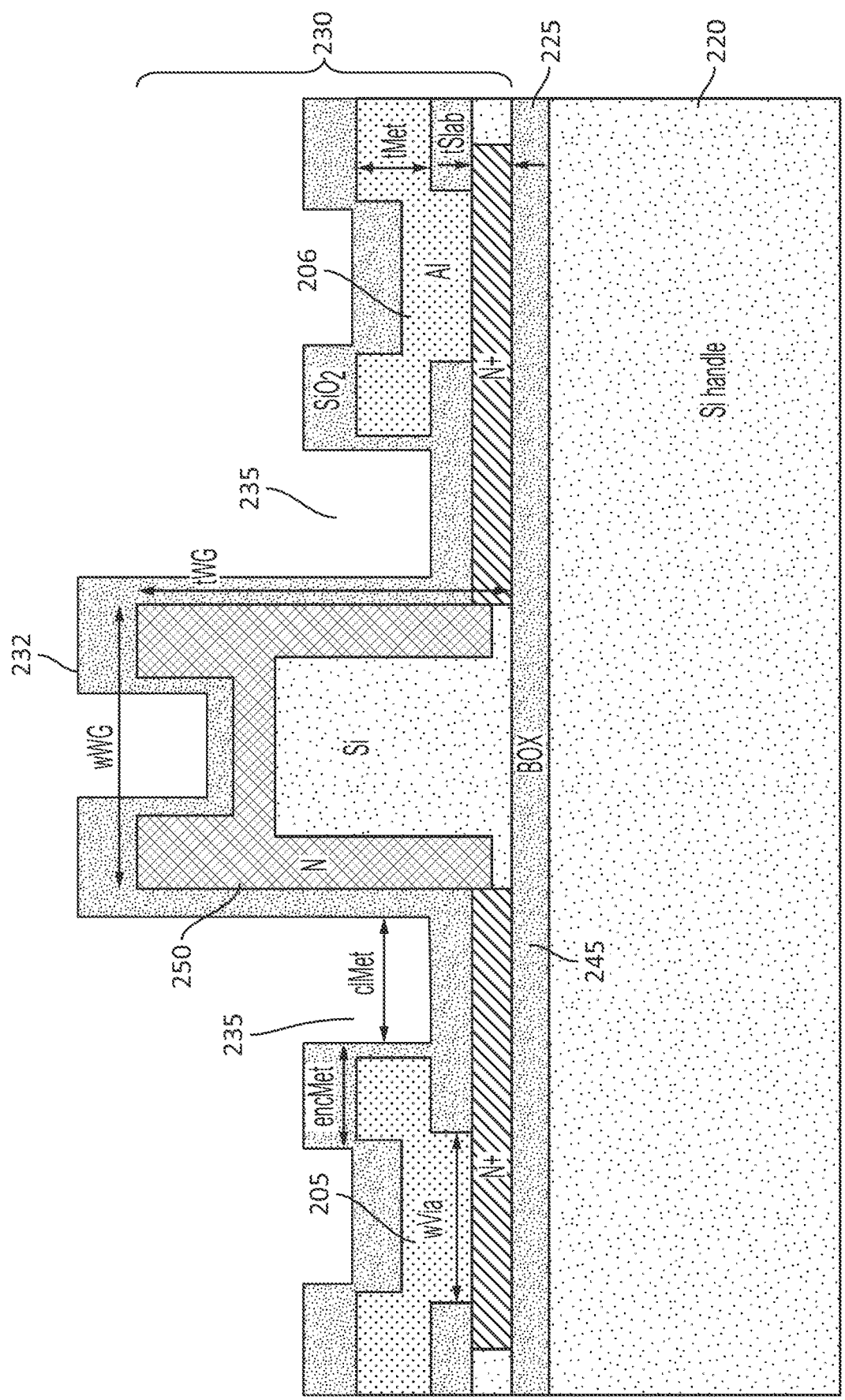
FIG. 5B is a schematic drawing of a waveguide structure, according to an embodiment of the present disclosure.
Figure 5D:
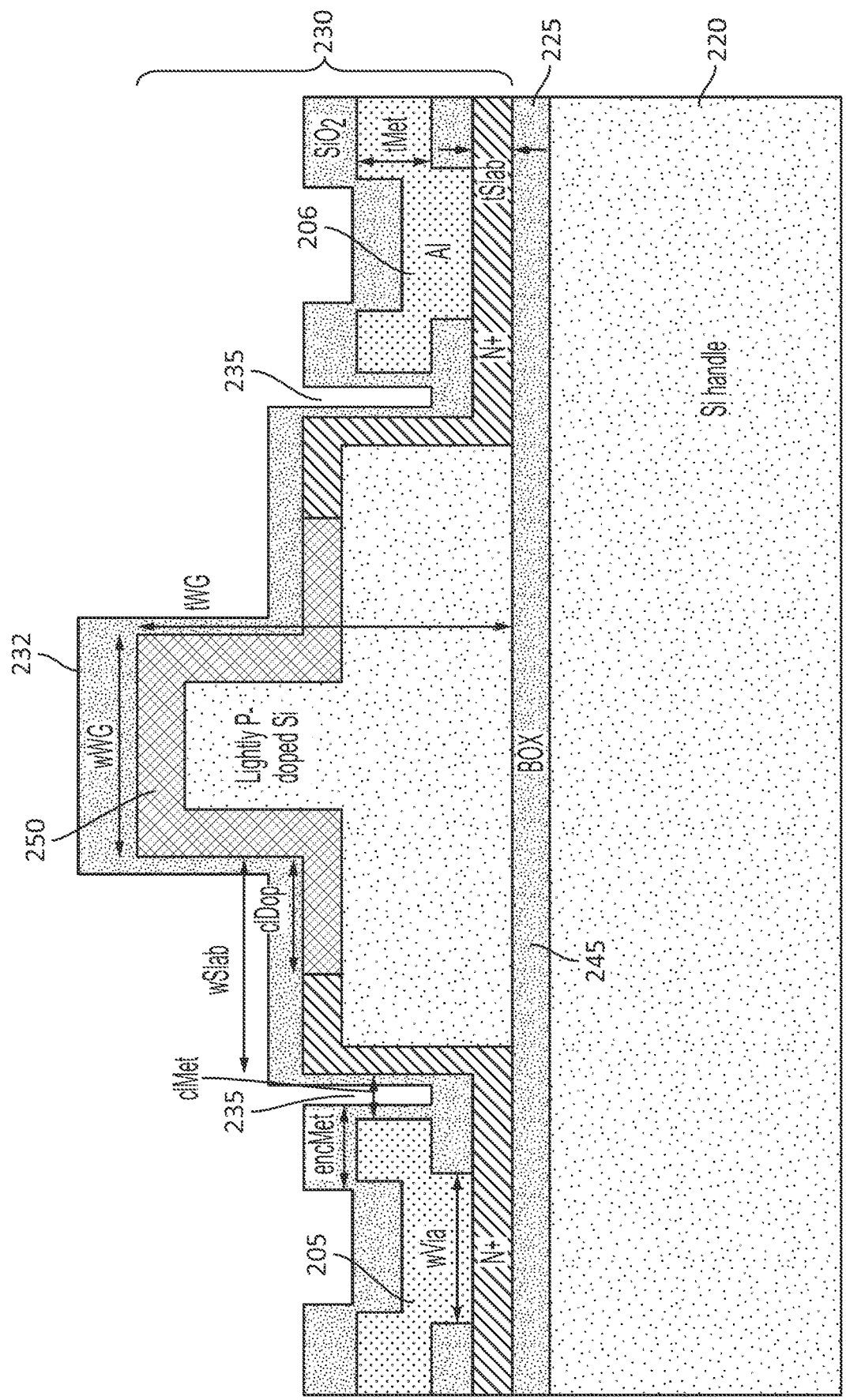
FIG. 5D is a schematic drawing of a waveguide structure, according to an embodiment of the present disclosure.

FIGS. 5A and 5B are cross sectional views (i) taken at a cutting plane that is perpendicular to the waveguide and that is between two of the trenches 125 used to form a Bragg grating, and (ii) taken at a cutting plane that is perpendicular to the waveguide and that passes through one of the trenches 125 used to form the grating, respectively, for one embodiment. In the embodiment of FIGS. 5A and 5B, the heating element is a lightly doped layer that wraps around the waveguide ridge, and that includes a lightly doped region just inside each sidewall of the waveguide ridge and a lightly doped region just below the top surface of the waveguide ridge. In the embodiment of FIGS. 5A and 5B, the waveguide is a strip waveguide. The table of FIG. 5E shows dimensions for the embodiment of FIGS. 5A and 5B.

Figure 6A:
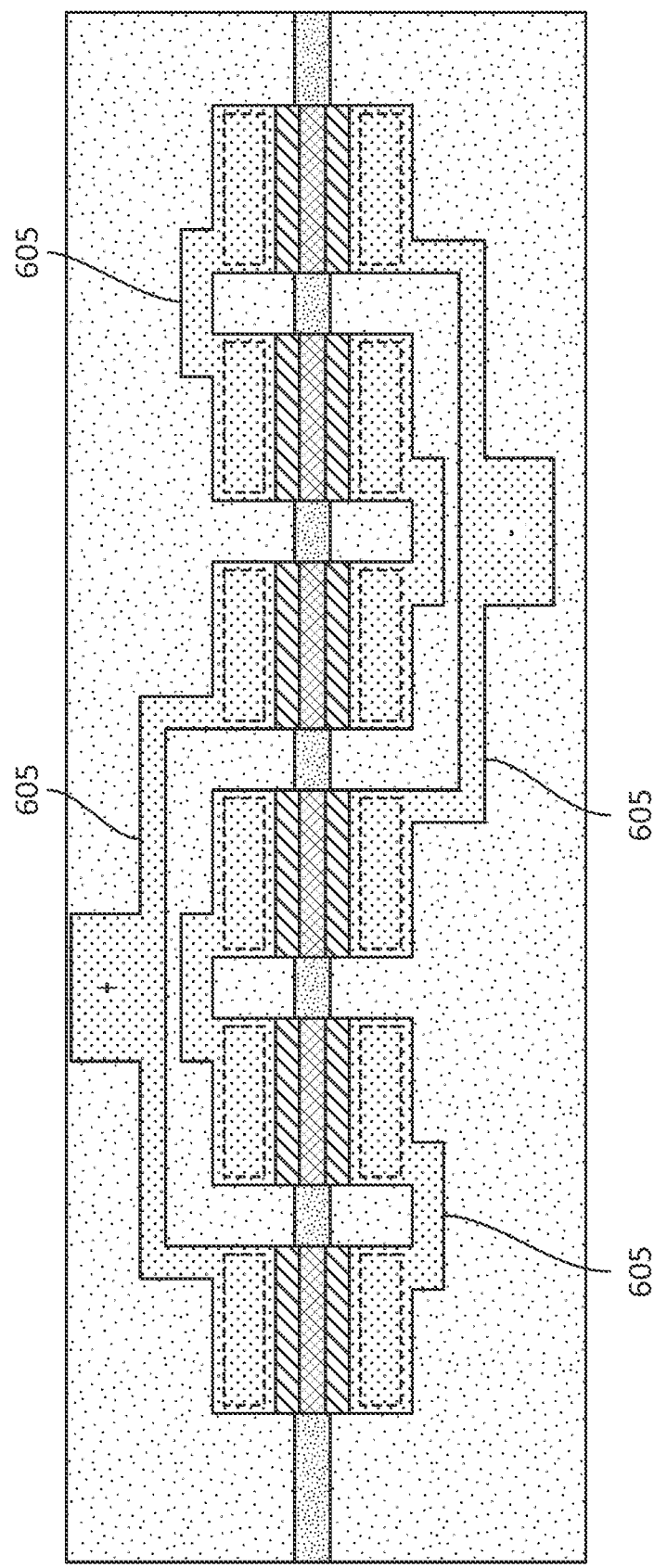
FIG. 6A is a schematic drawing of a composite heater, according to an embodiment of the present disclosure.
Figure 6B:
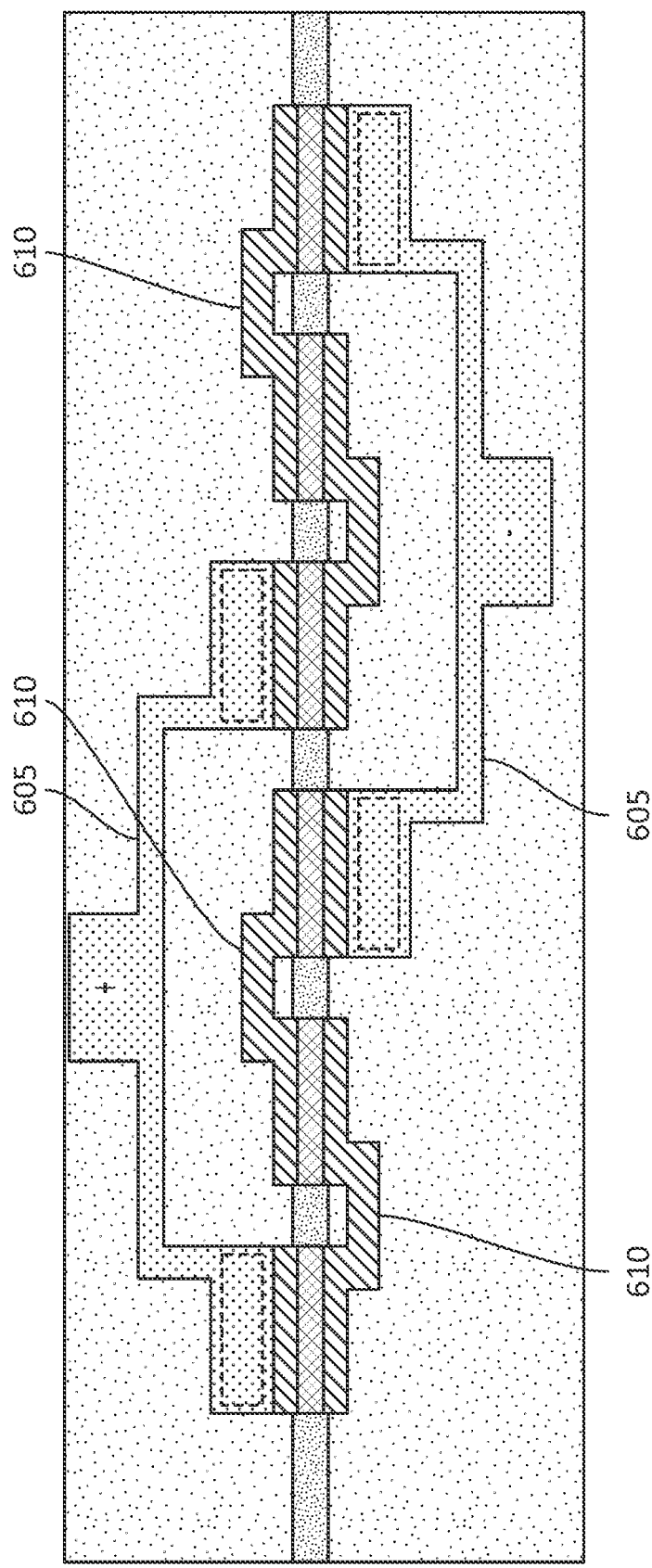
FIG. 6B is a schematic drawing of a composite heater, according to an embodiment of the present disclosure.
Figure 7:
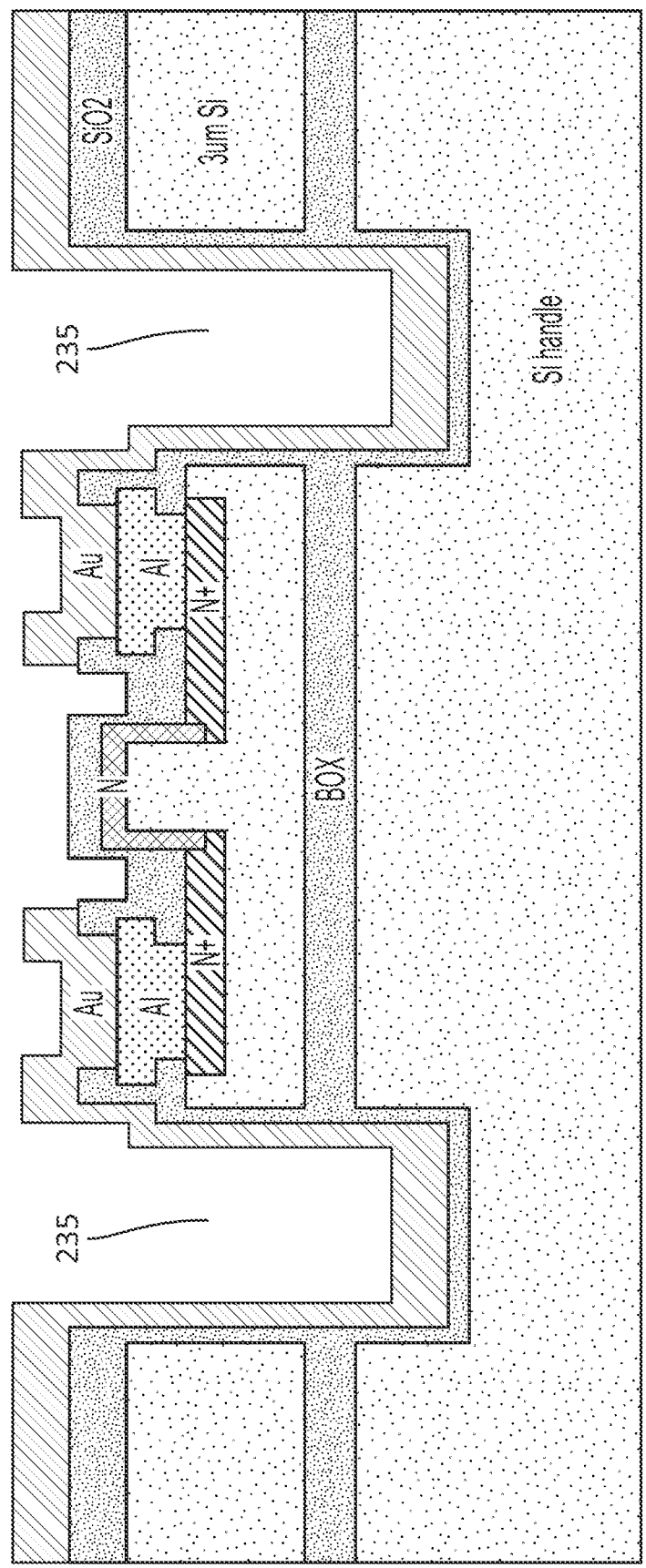
FIG. 7 is a schematic drawing of a waveguide structure, according to an embodiment of the present disclosure.

FIGS. 6A and 6B show composite heaters each of which includes a series-parallel combination of heaters. FIG. 6B differs from FIG. 6A in that metal wires 605 are used to connect the component heaters in FIG. 6A, and high-dose doping (e.g., high-dose N doping) is used to form the connections 610 that connect the component heaters in FIG. 6B. FIG. 7 is a cross-sectional view of an embodiment in which the thermal isolation trenches 235 each of which is on the outside of a respective one of the vias 205, 206 extend all the way through the device layer 230, through the buried oxide layer 225, and part-way into the substrate 220.

As used herein, a "heating element" is a structure of relatively low conductivity that, in operation, converts electrical power to heat. As used herein, a "heater" is a structure that includes a heating element (and that may include other conductive elements for carrying current to and from the heating element) and that in operation may be used to generate heat from electric current. For example, the lightly doped regions of the embodiment of FIG. 2A may form a heating element, which together with the moderately and heavily doped regions (or together with the moderately and heavily doped regions and with the metal wires) may form a heater. A heater may include a plurality of heaters, e.g., a heater may consist of two or more heaters connected in parallel or of two or more heaters connected in series, or a heater may combinations or series-connected and parallel-connected heaters.

As used herein, a "waveguide structure" is a structure including a waveguide (and which may also include, e.g., conductors for supplying current to a heating element in the waveguide, or thermal isolation trenches). As used herein, a "waveguide ridge" is a raised portion that contributes to the confinement of light in a waveguide. As such, a strip waveguide on a lower (e.g. BOX) cladding layer may be referred to as a waveguide ridge, and the rib of a rib waveguide may be referred to as a waveguide ridge. As used herein, a "contact" is a structure that allows current to flow from one conductive structure (such as a metal conductor) to another conductive structure (such as a doped region). As used herein, the "conductivity distribution" of a device is the conductivity as a function of position within the device.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X-Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

Although limited embodiments of a waveguide heater have been specifically described and illustrated herein, many modifications and variations will be apparent to those skilled in the art. Accordingly, it is to be understood that a waveguide heater employed according to principles of this disclosure may be embodied other than as specifically described herein. Features of some embodiments are also defined in the following claims, and equivalents thereof.

What is claimed is:

1. An optical waveguide structure, comprising:
   a semiconductor waveguide having a waveguide ridge, and
   a heater,
   the waveguide ridge having a varying dopant concentration across its cross-section and a doped portion extending across an optical core of the waveguide ridge,
   the heater comprising a first contact and a second contact,
   the waveguide structure comprising a conductive path from the first contact to the second contact, the conductive path extending through the doped portion of the waveguide ridge,
   wherein the conductive path is such that, when a potential difference is provided between the first and second contacts, a current flows through the optical core of the waveguide ridge.

2. The optical waveguide structure of claim 1, wherein the first contact and the second contact are on opposite sides of the waveguide ridge.

3. The optical waveguide structure of claim 1, wherein the optical waveguide structure has a conductivity distribution such that the potential difference between the first contact and the second contact results in a current, between the first contact and the second contact, at least half of which flows through the waveguide ridge.

4. The optical waveguide structure of claim 3, wherein the current is, at a point within the waveguide ridge, in a direction that is within 45 degrees of a direction perpendicular to the waveguide ridge.

5. The optical waveguide structure of claim 1, wherein:
   the waveguide ridge has a top surface; and
   a doping concentration within the waveguide ridge at a first depth, from the top surface, is at least 10% greater than a doping concentration within the waveguide ridge at a second depth, from the top surface, the second depth being greater than the first depth.

6. The optical waveguide structure of claim 1, wherein the waveguide ridge has a first sidewall and a second sidewall, and a doping concentration, at a point midway between the first sidewall and the second sidewall, between $5e16/cm^3$ and $5e17/cm^3$.

7. The optical waveguide structure of claim 1, wherein the waveguide structure is configured to have, in steady state operation with a voltage of 3 V between the first contact and the second contact, a temperature that is uniform to within 30 degrees C. within a waveguide of the waveguide structure.

8. The optical waveguide structure of claim 1, wherein, in steady state operation with a voltage of 3 V between the first contact and the second contact, the minimum temperature within the semiconductor waveguide is at least 20 degrees greater than in steady state operation with no current flowing through the heater.

9. The optical waveguide structure of claim 1, wherein a waveguide of the waveguide structure has an optical insertion loss of less than 1 dB per millimeter.

10. The optical waveguide structure of claim 1, wherein the waveguide structure comprises a grating having a temperature-dependent reflectivity peak.

11. A distributed Bragg reflector laser, comprising the waveguide structure of claim 10.

12. The optical waveguide structure of claim 10, wherein:
   in steady state operation, with a voltage of 0 V between the first contact and the second contact, the reflectivity peak is at a first wavelength,
   in steady state operation, with a voltage of 3 V between the first contact and the second contact, the reflectivity peak is at a second wavelength, and
   the second wavelength is greater than the first wavelength by at least 0.1 nm.

13. The optical waveguide structure of claim 12, wherein the power dissipated in the heater, with a voltage of 3 V between the first contact and the second contact, is less than 1 W.

14. The optical waveguide structure of claim 1, comprising a rib waveguide.

15. The optical waveguide structure of claim 1, comprising a strip waveguide.

16. The optical waveguide structure of claim 1, wherein the waveguide ridge has a width greater than 2 microns.

17. The optical waveguide structure of claim 1, wherein:
   the waveguide structure is on a silicon on insulator chip, comprising:
      a substrate,
      a buried oxide layer on the substrate, and
      a device layer on the buried oxide layer; and
   the waveguide structure comprises a trench, in the device layer, between the semiconductor waveguide and the first contact, a thickness of the device layer at a bottom of the trench being less than 1 micron.

18. The optical waveguide structure of claim 1, wherein a time constant of the waveguide structure, relating current flow through the heater to temperature of a waveguide of the waveguide structure, is less than 20 microseconds.

19. The optical waveguide structure of claim 1, further comprising a diode connected in series with the heater.

20. The optical waveguide structure of claim 1, wherein the heater comprises a first heater and a second heater, connected in parallel.

21. The optical waveguide structure of claim 1, wherein the heater comprises a first heater and a second heater, connected in series.

* * * * *